(12) United States Patent
Guillou et al.

(10) Patent No.: US 11,774,644 B1
(45) Date of Patent: Oct. 3, 2023

(54) ELECTRONIC DEVICES WITH IMAGE TRANSPORT LAYERS HAVING LIGHT ABSORBING MATERIAL

(71) Applicant: Apple Inc., Cupertino, CA (US)

(72) Inventors: Jean-Pierre S. Guillou, Los Gatos, CA (US); Michael J. Brown, Campbell, CA (US); Michael B. Wittenberg, San Francisco, CA (US); Wei Lin, Santa Clara, CA (US); Salman Karbasi, San Jose, CA (US); Shubhaditya Majumdar, Santa Clara, CA (US); Ian T. Clark, San Jose, CA (US); Nathan K. Gupta, San Francisco, CA (US); Prabhakar Gulgunje, Cupertino, CA (US); Chunchia Huang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 307 days.

(21) Appl. No.: 16/902,091

(22) Filed: Jun. 15, 2020

Related U.S. Application Data

(60) Provisional application No. 62/893,540, filed on Aug. 29, 2019.

(51) Int. Cl.
  *G02B 5/00* (2006.01)
  *G02B 1/14* (2015.01)
  (Continued)

(52) U.S. Cl.
  CPC .............. *G02B 5/003* (2013.01); *G02B 1/14* (2015.01); *G02B 6/02* (2013.01); *G02F 1/0063* (2013.01); *H05K 5/0017* (2013.01)

(58) Field of Classification Search
  CPC .... G02F 1/0115; G02F 1/0118; G02F 1/0063; G02F 1/1323; H05K 5/0017; G02B 6/02; G02B 1/14; G02B 5/003
  See application file for complete search history.

(56) References Cited

U.S. PATENT DOCUMENTS

| | | |
|---|---|---|
| 4,349,817 A | 9/1982 | Hoffman et al. |
| 4,534,813 A | 8/1985 | Williamson et al. |
| (Continued) | | |

FOREIGN PATENT DOCUMENTS

| | | |
|---|---|---|
| KR | 20180034832 A | 4/2018 |

*Primary Examiner* — Mariam Qureshi
(74) *Attorney, Agent, or Firm* — Treyz Law Group, P.C.; Joseph F. Guihan

(57) ABSTRACT

An electronic device may have a housing with a display. A protective display cover layer for the display may have an image transport layer formed from fibers or Anderson localization material. The image transport layer may include light absorbing material. Light absorbing material may be incorporated as an additive into a component of the image transport layer such as the binder layer of a coherent fiber bundle or the cladding of fibers in the image transport layer. The image transport layer may also be formed from fibers with a light absorbing layer formed in addition to a transparent cladding. The image transport layer may be formed from Anderson localization material that has light absorbing material. Fibers for the image transport layer may be extruded with light absorbing portions. A polymer preform having light absorbing material may be drawn to form fibers for the image transport layer.

12 Claims, 17 Drawing Sheets

(51) Int. Cl.
*G02B 6/02* (2006.01)
*H05K 5/00* (2006.01)
*G02F 1/00* (2006.01)

(56) References Cited

U.S. PATENT DOCUMENTS

| | | | |
|---|---|---|---|
| 5,329,386 A | 7/1994 | Birecki et al. | |
| 5,502,457 A | 3/1996 | Sakai et al. | |
| 5,659,378 A | 8/1997 | Gessel | |
| 6,046,730 A | 4/2000 | Bowen et al. | |
| 6,222,973 B1 * | 4/2001 | Starodubov | G02B 6/02104 385/128 |
| 6,407,785 B1 | 6/2002 | Yamazaki | |
| 6,467,922 B1 | 10/2002 | Blanc et al. | |
| 6,680,761 B1 | 1/2004 | Greene et al. | |
| 6,845,190 B1 | 1/2005 | Smithwick et al. | |
| 7,058,267 B2 | 6/2006 | Neuhaus et al. | |
| 7,228,051 B2 | 6/2007 | Cok et al. | |
| 7,437,046 B2 | 10/2008 | DiGiovanni et al. | |
| 7,542,209 B2 | 6/2009 | McGuire, Jr. | |
| 7,823,309 B2 | 11/2010 | Albenda | |
| 7,856,161 B2 | 12/2010 | Tabor | |
| 8,045,270 B2 | 10/2011 | Shin et al. | |
| 8,254,746 B2 | 8/2012 | Schick et al. | |
| 8,723,824 B2 | 5/2014 | Myers et al. | |
| 8,824,779 B1 | 9/2014 | Smyth | |
| 8,976,324 B2 | 3/2015 | Yang et al. | |
| 9,025,111 B2 | 5/2015 | Teller et al. | |
| 9,241,433 B2 | 1/2016 | Shah et al. | |
| 9,268,068 B2 | 2/2016 | Lee | |
| 9,312,517 B2 | 4/2016 | Drzaic et al. | |
| 9,342,105 B2 | 5/2016 | Choi et al. | |
| 9,509,939 B2 | 11/2016 | Henion et al. | |
| 9,591,765 B2 | 3/2017 | Kim et al. | |
| 9,755,004 B2 | 9/2017 | Shieh et al. | |
| 9,818,725 B2 | 11/2017 | Bower et al. | |
| 9,907,193 B2 | 2/2018 | Lee et al. | |
| 10,048,532 B2 | 8/2018 | Powell et al. | |
| 10,052,831 B2 | 8/2018 | Welker et al. | |
| 10,307,211 B2 * | 6/2019 | Tojo | A61B 1/00167 |
| 10,339,359 B2 | 7/2019 | Zhang et al. | |
| 10,387,712 B2 | 8/2019 | Zeng et al. | |
| 2006/0016448 A1 | 1/2006 | Ho | |
| 2007/0097108 A1 | 5/2007 | Brewer | |
| 2008/0144174 A1 | 6/2008 | Lucente et al. | |
| 2008/0186252 A1 | 8/2008 | Li | |
| 2008/0285125 A1 * | 11/2008 | Lee | G03B 21/60 359/449 |
| 2009/0129721 A1 * | 5/2009 | Chen | G01N 21/7703 385/12 |
| 2010/0177261 A1 | 7/2010 | Jin et al. | |
| 2010/0238090 A1 | 9/2010 | Pomerantz et al. | |
| 2011/0025594 A1 | 2/2011 | Watanbe | |
| 2011/0057861 A1 | 3/2011 | Cok et al. | |
| 2011/0102300 A1 | 5/2011 | Wood et al. | |
| 2011/0242686 A1 | 10/2011 | Wantanbe | |
| 2011/0255301 A1 * | 10/2011 | Watanabe | G02F 1/13336 362/558 |
| 2012/0218219 A1 | 8/2012 | Rappoport et al. | |
| 2013/0081756 A1 | 4/2013 | Franklin et al. | |
| 2013/0083080 A1 | 4/2013 | Rappoport et al. | |
| 2013/0235560 A1 | 9/2013 | Etienne et al. | |
| 2013/0279088 A1 | 10/2013 | Raff et al. | |
| 2014/0037257 A1 | 2/2014 | Yang et al. | |
| 2014/0092028 A1 | 4/2014 | Prest et al. | |
| 2014/0092346 A1 | 4/2014 | Yang et al. | |
| 2014/0183473 A1 | 7/2014 | Lee et al. | |
| 2014/0240985 A1 | 8/2014 | Kim et al. | |
| 2014/0328041 A1 | 11/2014 | Rothkopf et al. | |
| 2014/0354920 A1 | 12/2014 | Jang et al. | |
| 2015/0093087 A1 | 4/2015 | Wu | |
| 2015/0227227 A1 | 8/2015 | Myers et al. | |
| 2016/0231784 A1 | 8/2016 | Yu et al. | |
| 2016/0234362 A1 | 8/2016 | Moon et al. | |
| 2017/0235341 A1 | 8/2017 | Huitema et al. | |
| 2018/0033835 A1 | 2/2018 | Zeng et al. | |
| 2018/0052312 A1 | 2/2018 | Jia et al. | |
| 2018/0088416 A1 | 3/2018 | Jiang et al. | |
| 2018/0128973 A1 * | 5/2018 | Powell | H01L 51/5275 |
| 2018/0372958 A1 | 12/2018 | Karafin et al. | |
| 2021/0041624 A1 * | 2/2021 | Niwa | G02B 6/0078 |
| 2021/0294021 A1 * | 9/2021 | Romero | G02B 6/0065 |
| 2021/0333624 A1 * | 10/2021 | Schmidt | G02B 5/305 |

* cited by examiner

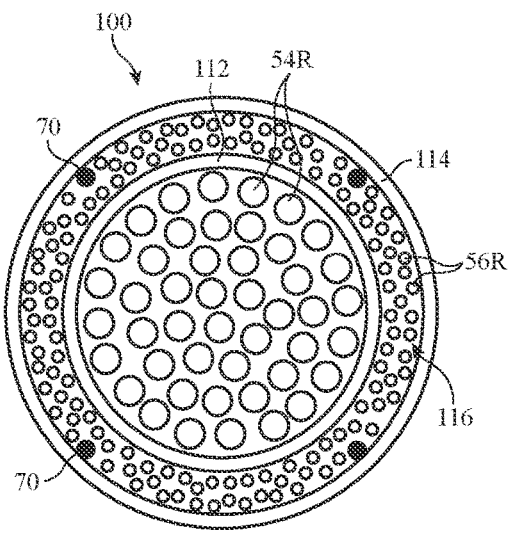
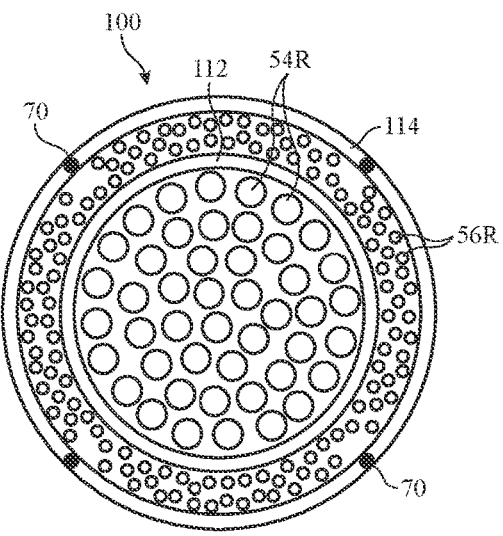
FIG. 16    FIG. 17
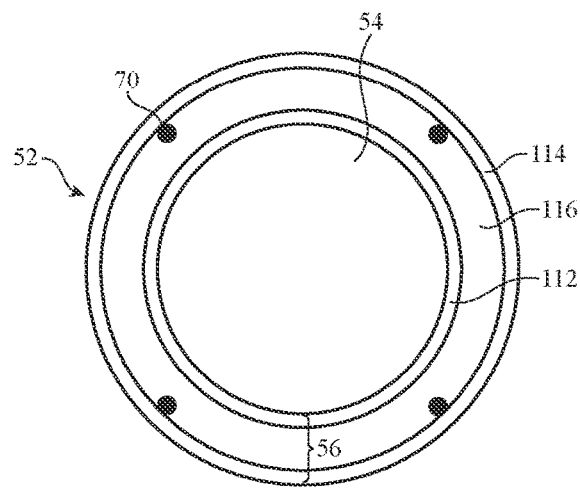
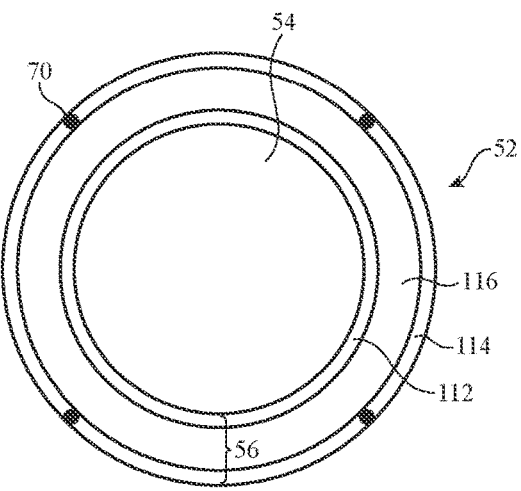
FIG. 18    FIG. 19

ELECTRONIC DEVICES WITH IMAGE TRANSPORT LAYERS HAVING LIGHT ABSORBING MATERIAL

This application claims the benefit of provisional patent application No. 62/893,540, filed Aug. 29, 2019, which is hereby incorporated by reference herein in its entirety.

FIELD

This relates generally to electronic devices, and, more particularly, to display cover layers for electronic devices.

BACKGROUND

Electronic devices may have displays. Displays have arrays of pixels for displaying images for a user. To prevent damage to the pixels, the pixels can be covered with a transparent display cover layer. If care is not taken, however, the inclusion of a display cover layer into an electronic device may cause the device to have larger inactive border regions than desired or may introduce undesired image distortion.

SUMMARY

An electronic device may have a housing. A display may be mounted in the housing. A protective display cover layer may be formed over the display. During operation, images on the display may be viewed through the protective display cover layer.

The protective display cover layer may have an image transport layer formed from fibers or Anderson localization material. The image transport layer may guide and expand image light from the display and thereby expand the effective size of images on the display. The expanded image size helps cover peripheral housing structures and minimizes the size of display borders.

The image transport layer may include light absorbing material. The light absorbing material may absorb unguided light in the image transport layer to increase contrast and reduce blur. Light absorbing material may be incorporated as an additive into a component of the image transport layer. For example, a light absorbing additive may be incorporated into the binder of a coherent fiber bundle or into the cladding of fibers in the image transport layer. The image transport layer may also be formed from fibers with a dedicated light absorbing layer in addition to a transparent cladding. The image transport layer may be formed from Anderson localization material that has light absorbing material.

To form the image transport layer, an extruder may form fiber bundles that each include a respective plurality of fibers distributed in binder material. The extruder may have hoppers that each contain raw material for a respective portion of the fibers. Light absorbing additive may be mixed into one of the hoppers with another raw material. Alternatively, the extruder may have a dedicated hopper for the light absorbing material. In some cases, fibers may be formed by drawing down a polymer preform. The polymer preform may have first, second, and third cladding portions. Light absorbing material such as pre-drawn light absorbing fibers may be incorporated into one of the cladding portions.

BRIEF DESCRIPTION OF THE DRAWINGS

FIG. 16 is a top view of an illustrative polymer preform that includes pre-drawn light absorbing fibers in a middle cladding portion in accordance with an embodiment.

FIG. 17 is a top view of an illustrative polymer preform that includes pre-drawn light absorbing fibers in an outer cladding portion in accordance with an embodiment.

FIG. 18 is a top view of an illustrative fiber that is formed by drawing the polymer preform of FIG. 16 in accordance with an embodiment.

FIG. 19 is a top view of an illustrative fiber that is formed by drawing the polymer preform of FIG. 17 in accordance with an embodiment.

DETAILED DESCRIPTION

An electronic device may have a display. The display may have an array of pixels for creating an image. The image may pass through a protective display cover layer that overlaps the array of pixels. To minimize display borders, the display cover layer may include an image transport layer formed from a coherent fiber bundle or Anderson localization material. The image transport layer may receive an image from a display at an input surface and may provide the image to a corresponding output surface for viewing by a user. The image transport layer may have a shape that helps expand the effective size of the image without imparting undesired distortion to the image and/or may have other configurations.

In one illustrative configuration, which may sometimes be described herein as an example, an image transport layer for the display in an electronic device is formed from a fiber optic plate that contains a coherent fiber bundle. In another illustrative configuration, an image transport layer for the display in an electronic device is formed from Anderson localization material.

Figure 1:
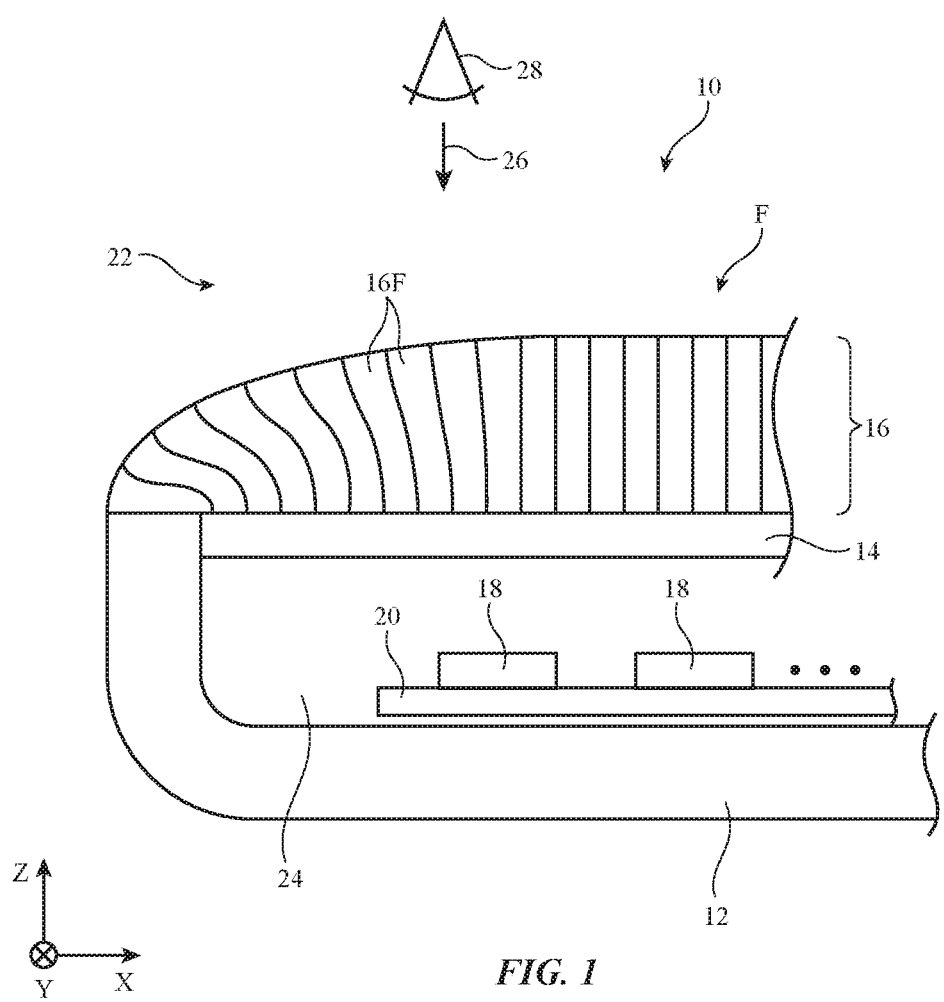
FIG. 1 is a side view of an illustrative electronic device with an image transport layer in accordance with an embodiment.

A cross-sectional side view of a portion of an illustrative electronic device with a display cover layer that includes an image transport layer is shown in FIG. 1. In the example of FIG. 1, device 10 is a portable device such as a cellular telephone, wristwatch, or tablet computer. Other types of devices may have display cover layers with image transport layers, if desired.

Device 10 includes a housing such as housing 12. Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose one or more interior regions such as interior region 24 and may separate interior region 24 from exterior region 22.

Electrical components 18 may be mounted in interior region 24. Electrical components 18 may include integrated circuits, discrete components, light-emitting components, sensors, and/or other circuits and may, if desired, be interconnected using signal paths in one or more printed circuits such as printed circuit 20. If desired, one or more portions of the housing walls may be transparent (e.g., so that light associated with an image on a display or other light-emitting or light-detecting component can pass between interior region 24 and exterior region 22).

Electrical components 18 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use sensors and other input-output circuitry to gather input and to provide output and/or to transmit signals to external equipment. The processing circuitry may be based on one or more microprocessors, microcontrollers, digital signal processors, baseband processors, power management units, audio chips, application specific integrated circuits, etc. The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 18.

Input-output circuitry in components 18 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using light-emitting diodes (e.g., crystalline semiconductor light-emitting diodes for status indicators and/or displays, organic light-emitting diodes in displays and other components), lasers, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 18) may include sensors. Sensors for device 10 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 18 may include mechanical devices for gathering input (e.g., buttons, joysticks, scrolling wheels, key pads with movable keys, keyboards with movable keys, and other devices for gathering user input). During operation, device 10 may use sensors and/or other input-output devices in components 18 to gather user input (e.g., buttons may be used to gather button press input, touch and/or force sensors overlapping displays can be used for gathering user touch screen input and/or force input, touch pads and/or force sensors may be used in gathering touch and/or force input, microphones may be used for gathering audio input, etc.). The control circuitry of device 10 can then take action based on this gathered information (e.g., by transmitting the information over a wired or wireless path to external equipment, by supplying a user with output using a haptic output device, visual output device, an audio component, or other input-output device in housing 12, etc.).

If desired, electronic device 10 may include a battery or other energy storage device, connector ports for supporting wired communications with ancillary equipment and for receiving wired power, and other circuitry. In some configurations, device 10 may serve as an accessory and/or may include a wired and/or wireless accessory (e.g., a keyboard, computer mouse, remote control, trackpad, etc.).

Device 10 may include one or more displays. The displays may, for example, include an organic light-emitting diode display, a liquid crystal display, a display having an array of pixels formed from respective light-emitting diodes (e.g., a pixel array having pixels with crystalline light-emitting diodes formed from respective light-emitting diode dies such as micro-light-emitting diode dies), and/or other displays. The displays may include rigid display structures and/or may be flexible displays. For example, a light-emitting diode display may be sufficiently flexible to be bent. Displays for device 10 may have pixel arrays for displaying images for a user. Each pixel array (which may sometimes be referred to as a display panel, display substrate, or display) may be mounted under a transparent display cover layer that helps to protect the pixel array. In the example of FIG. 1, pixel array (display) 14 is mounted under image transport layer 16. Optional additional layers (e.g., transparent layers of glass, crystalline material such as sapphire, etc.) may be stacked above and/or below layer 16. Layer 16 and these additional layers may serve as a protective display cover layer (and may sometimes be referred to as forming a transparent portion of the housing for device 10). The configuration of FIG. 1 in which a display cover layer for device 10 is formed from layer 16 is illustrative.

During operation, the pixels of display 14 produce image light that passes through optical structures 16F in layer 16 for viewing by a user such as viewer 28 who is viewing device 10 in direction 26 (e.g., a user who is viewing device 10 straight on in a direction parallel to the surface normal of a planar central portion of layer 16 on front face F, a user who is viewing device 10 at an off-axis viewing angle such as at a 45° angle to the surface normal of a planar central portion of layer 16, or a user who is viewing device 10 in other directions). Structures 16F may be optical fibers (e.g., in scenarios in which image transport layer 16 is a coherent fiber bundle) or other elongated optical features. For example, structures 16F may be filaments that have different refractive index values in scenarios in which image transport layer 16 is a layer of Anderson localization material. Structures 16F may be referred to as fibers 16F, filaments 16F, etc.

Optical structures 16F of image transport layer 16 allow an image produced by an array of pixels in a flat or curved display to be transferred from an input surface of a first shape at a first location to an output surface with a curved cross-sectional profile, compound curvature, or other desired second shape at a second location. The image transport layer may therefore move the location of an image and may optionally change the shape of the surface on which the image is presented.

Device 10 may have four peripheral edges and a rectangular footprint when viewed in direction 26 or may have other suitable shapes. To help minimize the size of inactive display borders as a user is viewing front face F of device 10 as shown in FIG. 1, the shapes of fibers 16F along the rectangular periphery of plate 16 may be deformed outwardly as shown in FIG. 1. The deformed shapes of fibers 16F help distribute image light laterally outwards in the X-Y plane so that the effective size of display 14 is enlarged and the image produced by display 14 covers some or all of the sidewalls of housing 12 when the image on front face F is being viewed by viewer 28. For example, the bent shapes of fibers 16F may help shift portions of the displayed image laterally outward in the X-Y plane along the edges and corners of device 10 to block the sidewall portions of housing 12 from view. In some arrangements, the portions of fibers 16F at the outermost surface of layer 16 are oriented parallel or nearly parallel with viewing direction 26 and the Z axis of FIG. 1, which helps ensure that some or all of the light that has passed through plate 16 will travel in the Z direction and be viewable by viewer 28.

Layer 16 may be formed from any suitable material such as polymer, glass, crystalline material such as sapphire, transparent ceramic, and/or other materials. Examples in which layer 16 is formed from polymer are sometimes described herein as an example. The polymer materials used in forming may be formed from glassy polymers such as polymethylmethacrylate (PMMA), polyester, or other amorphous polymers and/or may be formed from semicrystalline polymers such as fluoropolymers (e.g., THV or PVDF).

Figure 2:
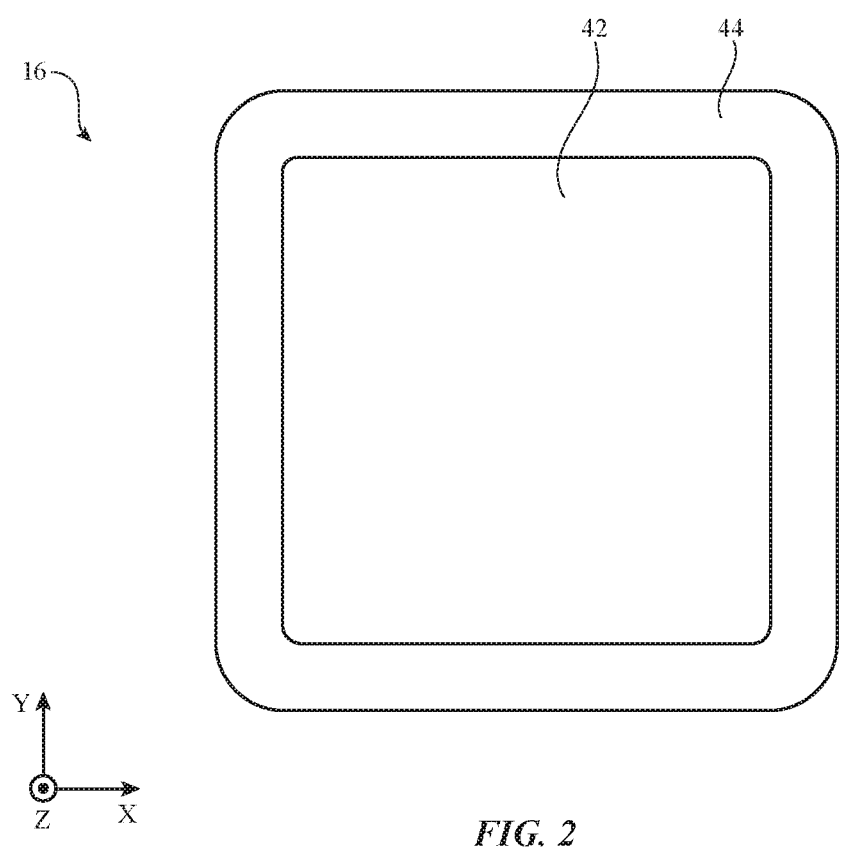
FIG. 2 is a top view of an illustrative image transport layer in accordance with an embodiment.

A top view of an image transport layer is shown in FIG. 2. As shown, the image transport layer may have a central portion 42. Central portion 42 may have fibers that are not bent and may sometimes be referred to as an unformed portion or unbent portion of the image transport layer. The unformed portion of the image transport layer may be surrounded by a peripheral portion 44 of the image transport layer in which the fibers are bent (sometimes referred to as a formed portion or bent portion). As shown in the top view of FIG. 2, portion 44 may extend in a ring around portion 42 (e.g., portion 44 may laterally surround portion 42). Portion 44 may have fibers that are bent in order to hide an inactive border area of the display.

As shown in FIG. 2, the image transport may have a rectangular footprint with rounded corners when viewed from above. The rounded corners may be bent downwards (e.g., in the negative Z-direction away from the viewer and towards the display panel). The output surface of the image transport layer may have compound curvature in the rounded corner regions.

Image transport layer 16 may convey light from an input surface to an output surface of arbitrary shape. Ideally, each optical structure of the image transport layer would convey light in an ordered manner without any cross-talk between optical structures. However, in practice there may be challenges in preventing cross-talk and other undesired light emissions. For example, highly angled light from display 14 may not be properly guided by optical structures 16F, resulting in improper translation of the display light between the input surface of the image transport layer and the output surface of the image transport layer. Light that is initially properly guided by optical structures 16F may be susceptible to exiting the optical structures 16F at bent portions of the optical structures. Additionally, ambient light may enter the image transport layer through the output surface and may reduce contrast in the displayed image.

To mitigate the presence of 'unguided' or otherwise undesired light, image transport layer 16 may include light absorbing material. The light absorbing material may sometimes be referred to as an electromagnetic absorber (EMA). There are many ways to incorporate light absorbing material into an image transport layer. The image transport layer may include light absorbing material in embodiments where the image transport layer is formed from a coherent fiber bundle or Anderson localization material.

Figure 3:
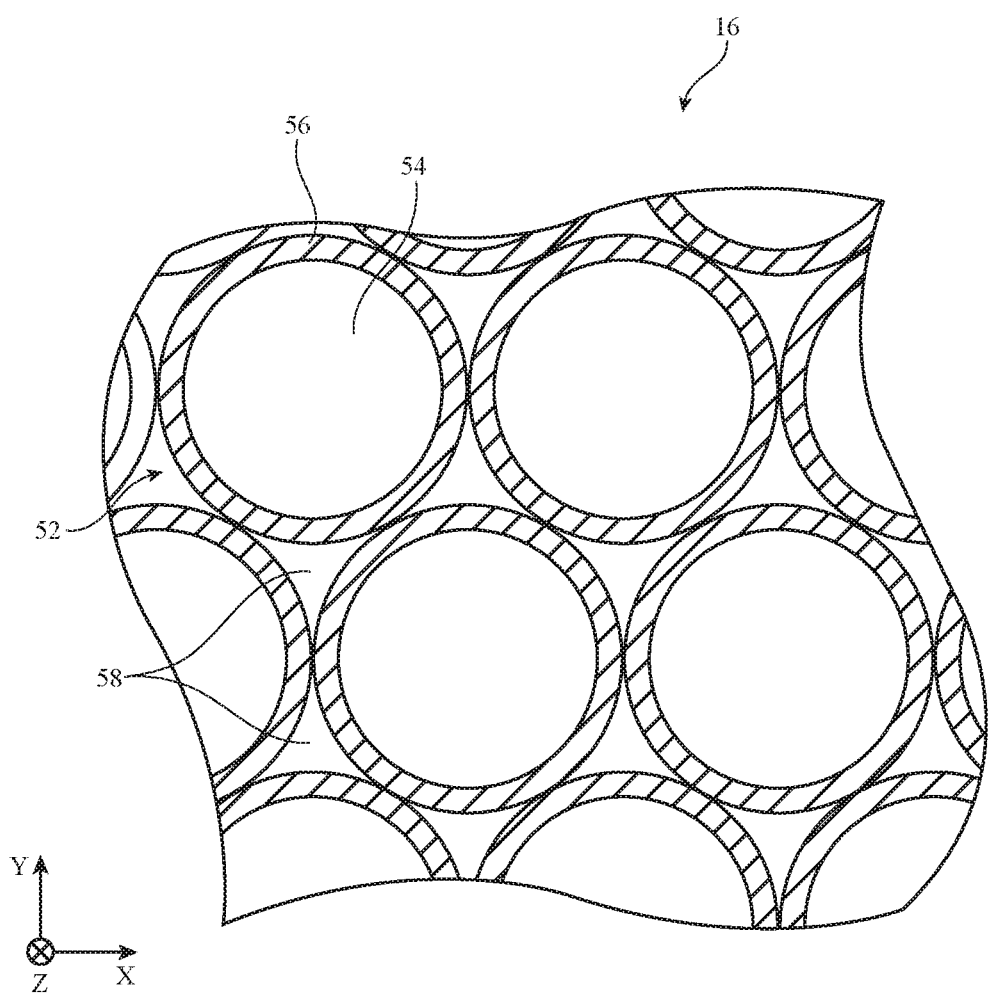
FIG. 3 is a top view of a portion of an image transport layer in accordance with an embodiment.

First, image transport layers that are formed from fibers and that include light absorbing material will be discussed. Fibers used to form image transport layer 16 may have any suitable configuration. A cross-sectional view of fiber optic plate 16 in an illustrative arrangement in which fibers 52 have multiple layers of material is shown in FIG. 3. As shown in FIG. 3, fibers 52 may each have a core such as core 54. Cores 54 and the other structures of image transport layer 16 may be formed from transparent materials such as polymer, glass, crystalline material such as sapphire, and/or other transparent materials. In an illustrative configuration, which may sometimes be described herein as an example, image transport layer 16 includes polymer fibers.

Fiber cores 54 may be formed from polymer of a first refractive index and may be surrounded by cladding 56 (e.g., polymer) of a second, lower refractive index. The difference in refractive index between cores 54 and cladding 56 may be greater than 0.1, greater than 0.2, greater than 0.3, between 0.2 and 0.4, etc. This arrangement allows fibers 52 to guide light in accordance with the principal of total internal reflection. Binder material 58 may hold fibers 52 together to form image transport layer 16 (fiber optic plate 16). The fractional cross-sectional area occupied by core 54 may be between 65% and 85%, between 60% and 75%, greater than 60%, greater than 65%, greater than 70%, or another desired value. The fractional cross-sectional area occupied by cladding 56 may be between 2% and 10%, between 1% and 20%, greater than 5%, less than 20%, less than 15%, less than 10%, or another desired value. The fractional cross-sectional area occupied by binder material 58 may be between 2% and 10%, between 1% and 20%, greater than 5%, less than 20%, less than 15%, less than 10%, or another desired value.

The diameter of core 54 may be 5-15 microns or other suitable size (e.g., at least 3 microns, at least 7 microns, 10 microns, at least 15 microns, less than 20 microns, less than 14 microns, etc.). The thickness of cladding 56 may be 0.5 microns, at least 0.1 microns, at least 0.4 microns, less than 2 microns, less than 0.9 microns, or other suitable thickness. If desired, fibers 52 may contain more layers, fewer layers, layers arranged in different orders, and/or may have other configurations.

Figure 4:
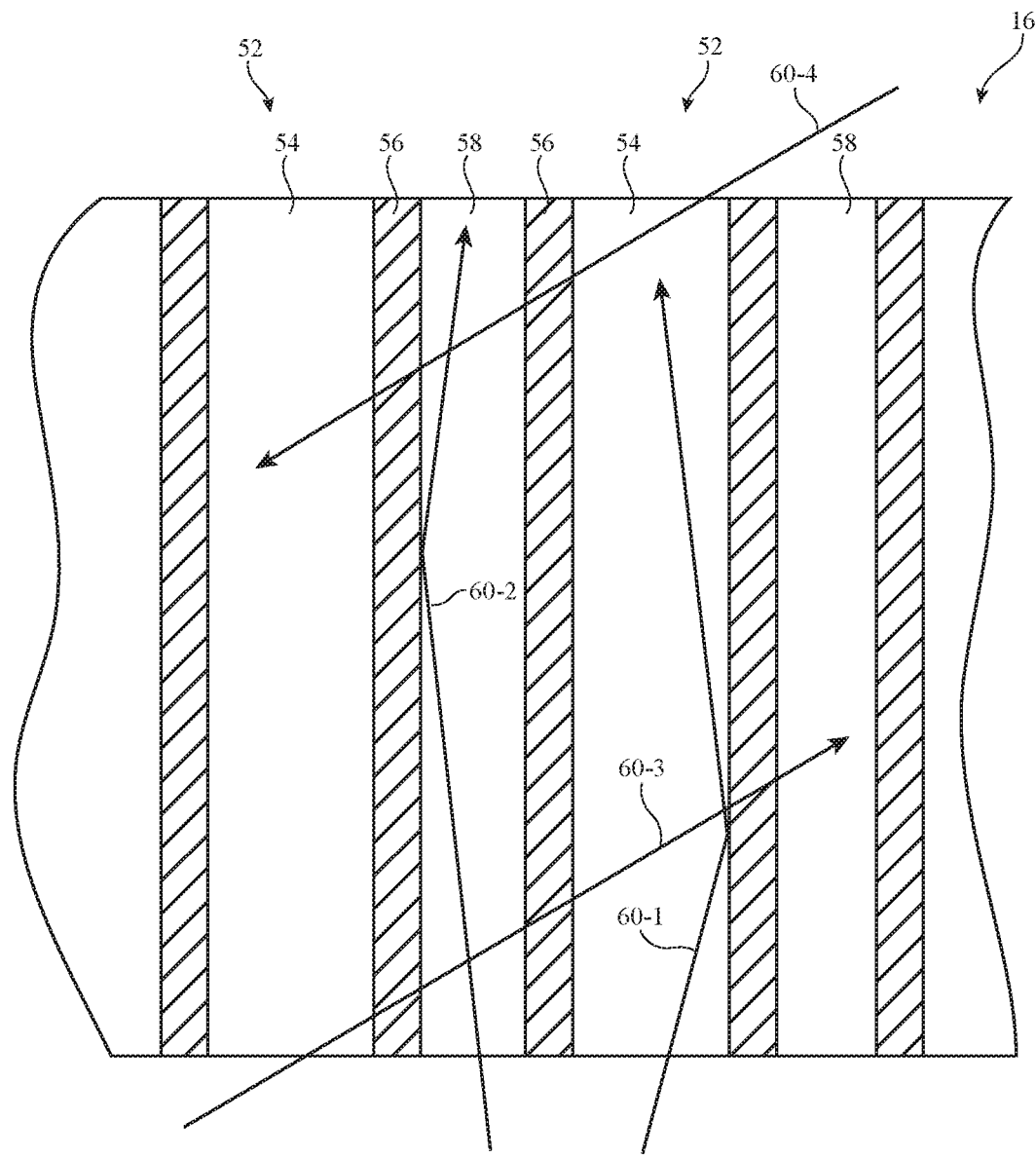
FIG. 4 is a cross-sectional side view of a portion of an image transport layer in accordance with an embodiment.

FIG. 4 is a cross-sectional side view of fibers that may be used to form an image transport layer (e.g., the fibers of FIG. 3). As shown, fibers 52 include cores 54 surrounded by cladding 56. Binder 58 is interposed between adjacent fibers 52 (e.g., between claddings 56 of adjacent fibers). Fibers 52 are used to guide light (e.g., from display 14 in FIG. 1). Light ray 60-1 shows an example of light being guided by a fiber. The index of refraction difference between cores 54 and cladding 56 allows fibers 52 to guide light 60-1 in accordance with the principal of total internal reflection.

As shown in FIG. 4, binder 58 may also guide light via total internal reflection. The difference in refractive index between binder 58 and cladding 56 may be greater than 0.01, greater than 0.05, greater than 0.1, greater than 0.2, greater than 0.3, between 0.2 and 0.4, etc. Having a refractive index difference between binder 58 and cladding 56 allows the portions of binder 58 between fibers 52 to serve as 'supplemental cores' that guide light in a similar fashion to cores 54 of fibers 52. Light ray 60-2 shows an example of light being guided by binder 58 between fibers 52 in accordance with the principle of total internal reflection.

Light rays 60-1 and 60-2 may be examples of 'guided' light that is desirably conveyed from the input surface of layer 16 to the output surface of layer 16. In general, it may be desirable to maximize the transmission of this type of light to improve the efficiency of the display and minimize blur. In contrast, it may be desirable to minimize the transmission of unguided light that is not guided by fiber cores 54 or binder 58. Light rays 60-3 and 60-4 show examples of unguided light. As shown, light ray 60-3 may enter image transport layer 16 at the input surface at a high angle. Due to the high angle of incidence, the light ray may pass through the core-cladding interface of fiber 52 (instead of undergoing total internal reflection at the core-cladding interface as with light ray 60-1). Light ray 60-3 may pass through image transport layer 16 in an unguided fashion and may ultimately be emitted from the output surface of the image transport layer at a location that does not match the proper location in the displayed image. Similarly, light ray 60-4 may be ambient light that enters image transport layer 16 through the output surface of the image transport layer. Light ray 60-4 may pass through the image transport layer (from output surface to input surface), reflect off of the surface of display 14, and pass through the image transport layer (from input surface to output surface) where it is emitted from the image transport layer. The paths of light 60-1, 60-2, 60-3, and 60-4 depicted in FIG. 4 are merely illustrative. In practice, there may be refraction at the interfaces between different components (e.g., light 60-3 and 60-4 may be refracted while passing in an unguided manner through the image transport layer), but changes of direction due to refraction have been omitted from FIG. 4 for simplicity of the drawing.

It may be desirable to maximize transmission of certain types of light (e.g., guided light 60-1 and 60-2) but minimize transmission of other types of light (e.g., unguided light 60-3 and 60-4). The examples in FIG. 4 are merely illustrative. It may be desirable to mitigate transmission of other types of light than those shown in FIG. 4. For example, ambient light may enter and be guided by cores 54, cladding 56, and/or binder 58. Ideally, this ambient light would be absorbed and not emitted from the output surface of the image transport layer.

Light absorbing material may be incorporated into image transport layer 16 to absorb light and prevent transmission of undesired types of light. The more light absorbing material included in the image transport layer, the more the undesired light may be absorbed. However, the light properly guided by cores 54 or binder 58 may also, undesirably be absorbed. Therefore, the amount and absorbance of light absorbing material incorporated into the image transport layer may be selected to balance the mitigation of undesired light transmissions with ensuring satisfactory transmission of desired light transmissions.

Figure 5:
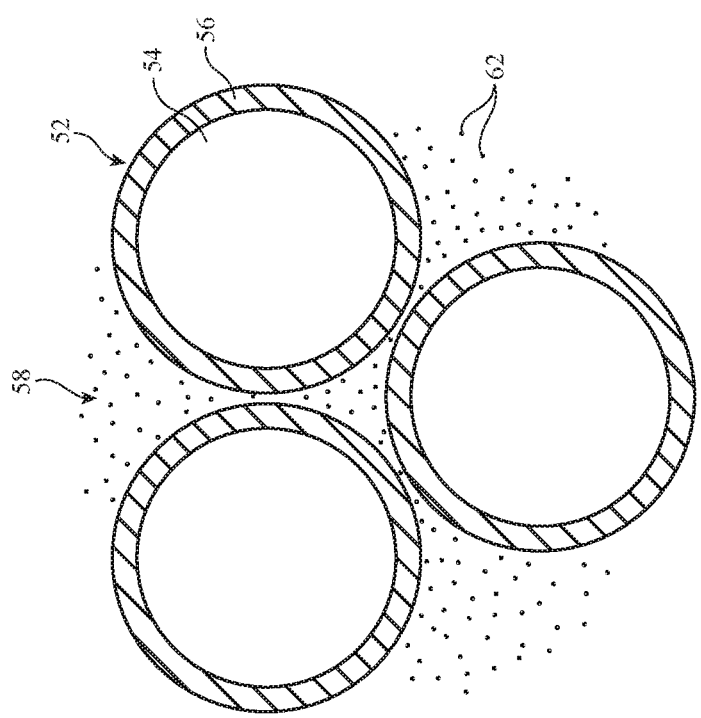
FIG. 5 is a top view of illustrative fibers for an image transport layer with light absorbing material incorporated into the binder layer in accordance with an embodiment.

There are many ways to incorporate light absorbing material into an image transport layer formed from fibers. FIG. 5 is a top view of illustrative fibers that have light absorbing material incorporated into the binder material. The fibers in FIG. 5 may have a similar structure to those in FIGS. 3 and 4, with each fiber 52 having a core 54 and cladding 56. Binder 58 (sometimes referred to as binder layer 58, binder material 58, etc.) may hold together the fibers 52. In FIG. 5, a light absorbing material 62 is incorporated into binder layer 58. The light absorbing material 62 may be black pigment, black dye, or other light absorbing material that absorbs and blocks light (e.g., carbon black based material, carbon nanotubes, graphite nanoplatelets, etc.).

In FIG. 5, light absorbing material 62 (sometimes referred to as EMA 62, dye 62, pigment 62, etc.) is incorporated as an additive into binder 58. Unlike cladding 56, which is coated on and surrounds the core 54, binder 58 fills the interstitial space between the fibers. Binder 58 may be formed from a transparent polymer. With the additive included, binder layer 58 in FIG. 5 may be gray (e.g., partially light absorbing). The EMA additive may be evenly distributed throughout the binder layer such that the binder layer has a uniform color (e.g., a uniform gray binder layer).

As previously mentioned, binder 58 may guide light from display 14 from the input surface of the image transport layer to the output surface of the image transport layer (e.g., the binder may serve as a supplemental core). Therefore, incorporating additive 62 into binder 58 may undesirably lower the transmission of this guided light. The additive may instead be incorporated into the cladding to avoid this issue.

Figure 6:
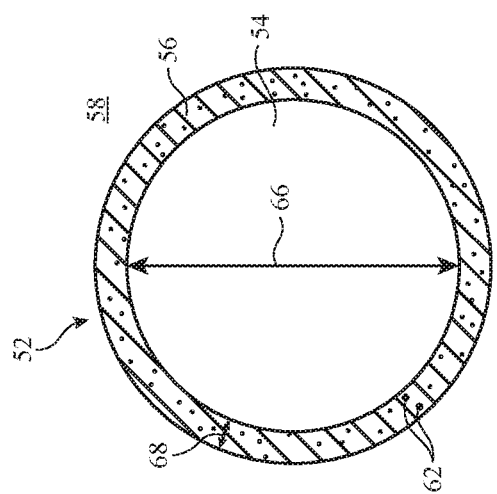
FIG. 6 is a top view of an illustrative fiber for an image transport layer with light absorbing material incorporated into the cladding in accordance with an embodiment.

FIG. 6 is a top view of an illustrative fiber that has light absorbing material incorporated into a cladding. Fiber 52 has a core 54 and cladding 56. Binder 58 may hold together fiber 52 with other neighboring fibers having the same structure. In FIG. 6, a light absorbing material 62 is incorporated into cladding 56. The light absorbing material 62 may be black pigment, black dye, or other light absorbing material that absorbs and blocks light. Cladding 56 may be formed from a transparent polymer. With the additive included, cladding 56 in FIG. 6 may be gray (e.g., partially light absorbing). The EMA additive may be evenly distributed throughout the cladding such that the cladding has a uniform color (e.g., a uniform gray cladding).

In the arrangement of FIG. 6, core 54 may have a diameter 66 and cladding 56 may have a thickness 68. Diameter 66 may be 5-15 microns at least 3 microns, at least 7 microns, 10 microns, 8-12 microns, at least 15 microns, less than 20 microns, less than 14 microns, etc. Thickness 68 may be less than 1 micron, less than 2 microns, greater than 0.1 micron, between 0.2 and 1.0 microns, etc. The refractive index of core 54 may be greater than 1.6, between 1.6 and 1.7, between 1.63 and 1.67, greater than 1.5, less than 1.7, etc. The refractive index of cladding 56 may be less than 1.4, between 1.3 and 1.4, between 1.33 and 1.37, etc. The refractive index of binder 58 may be greater than 1.5, greater than 1.55, between 1.5 and 1.65, between 1.5 and 1.6, between 1.55 and 1.6, etc.

Figure 8:
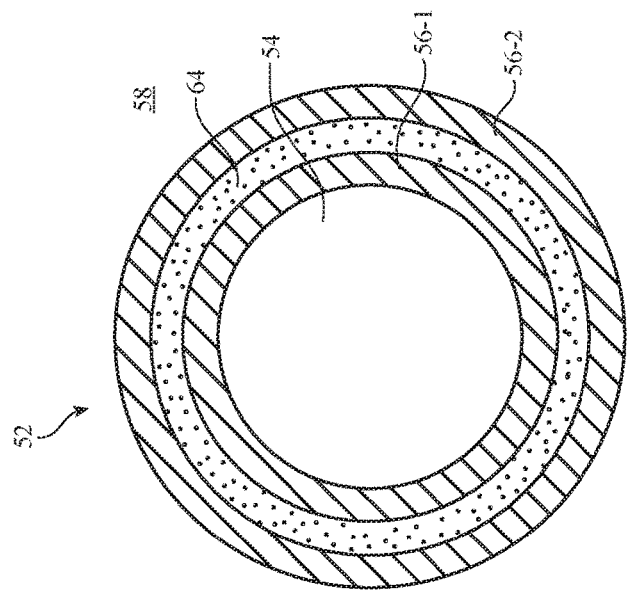
FIG. 8 is a top view of an illustrative fiber for an image transport layer with a light absorbing layer interposed between first and second transparent claddings in accordance with an embodiment.
Figure 7:
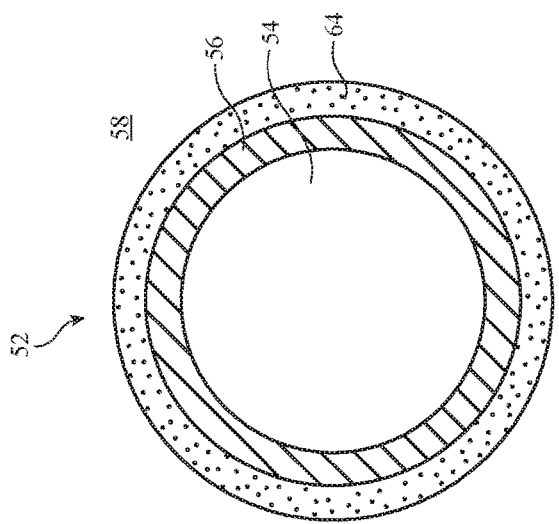
FIG. 7 is a top view of an illustrative fiber for an image transport layer with a light absorbing layer formed around a transparent cladding in accordance with an embodiment.

In FIGS. 5 and 6, light absorbing material is incorporated as an additive into binder 58 or cladding 56. These examples are merely illustrative. In another possible arrangement, a dedicated light absorbing layer may be incorporated into each fiber. FIGS. 7 and 8 show arrangements of this type.

FIG. 7 is a top view of an illustrative fiber that has a dedicated light absorbing layer formed around a cladding. As shown in FIG. 7, fiber 52 has a core 54 and cladding 56. Binder 58 may hold together fiber 52 with other neighboring fibers having the same structure. Fiber 52 also includes light absorbing layer 64. Light absorbing layer 64 may include black pigment, black dye, or other light absorbing material that absorbs and blocks light (e.g., carbon black based material, carbon nanotubes, graphite nanoplatelets, etc.). Light absorbing layer 64 may sometimes be referred to as light absorbing cladding layer 64 or light absorbing cladding 64. Light absorbing cladding 64 may include a light absorbing additive incorporated into a transparent polymer or may be formed from a light absorbing polymer (e.g., a gray or black polymer).

Light absorbing layer 64 in FIG. 7 may desirably mitigate transmission of certain types of light, but may undesirably mitigate transmission of guided light in binder layer 58. FIG. 8 is a top view of an illustrative fiber that has a dedicated light absorbing layer formed between two claddings to prevent absorption of light that is desirably guided through binder 58. As shown in FIG. 8, fiber 52 has a core 54, cladding 56-1, light absorbing layer 64 (light absorbing cladding 64), and cladding 56-2. Binder 58 may hold together fiber 52 with other neighboring fibers having the same structure. Light absorbing layer 64 may include black pigment, black dye, or other light absorbing material that absorbs and blocks light. Light absorbing layer 64 may include a light absorbing additive incorporated into a transparent polymer or may be formed from a light absorbing polymer (e.g., a gray or black polymer).

In FIG. 8, light absorbing layer 64 is interposed between first and second claddings 56-1 and 56-2. Consequently, light guided within binder layer 58 by total internal reflection will be less likely to be absorbed by light absorbing layer 64 (because the light will reflect off of cladding 56-2 before reaching light absorbing layer 64). In the arrangement of FIG. 8, core 54 may have a diameter 66 that is 5-15 microns, at least 3 microns, at least 7 microns, 10 microns, 8-12 microns, at least 15 microns, less than 20 microns, less than 14 microns, etc. Cladding 56-1 may have a thickness that is less than 1 micron, less than 2 microns, greater than 0.1 micron, between 0.2 and 1.0 microns, between 0.2 and 0.5 microns, less than 0.5 microns, etc. Light absorbing layer 64 may have a thickness that is less than 1 micron, less than 2 microns, greater than 0.01 micron, less than 0.5 microns, less than 0.3 microns, less than 0.2 microns, between 0.05 and 0.2 microns, etc. Cladding 56-2 may have a thickness that is less than 1 micron, less than 2 microns, greater than 0.01 micron, less than 0.5 microns, less than 0.3 microns, less than 0.2 microns, between 0.05 and 0.2 microns, etc.

Figure 9:
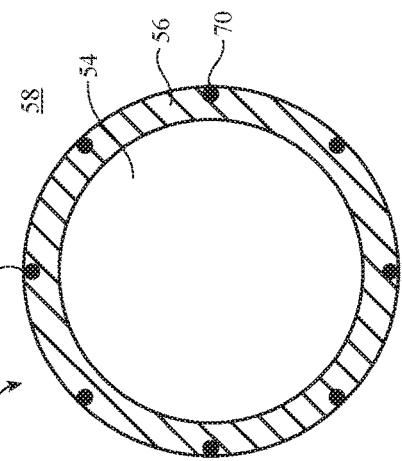
FIG. 9 is a top view of an illustrative fiber for an image transport layer with strips of light absorbing material integrated into the cladding in accordance with an embodiment.

FIG. 9 shows another possible arrangement for a fiber with light absorbing material. As shown in FIG. 9, fiber 52 has a core 54 and cladding 56. Binder 58 may hold together fiber 52 with other neighboring fibers having the same structure. Fiber 52 also includes light absorbing material 70. In FIG. 9, light absorbing material 70 may be gray or black fibers that are formed on an outer surface of cladding 56. The light absorbing fibers 70 may extend along the length of each fiber 52, effectively forming gray or black strips running along the length of fiber 52. Any number of light absorbing fibers 70 may be incorporated into each fiber 52. Having more light absorbing fibers will increase the overall absorption of stray light within the image transport layer. Light absorbing fibers 70 may sometimes be referred to as light absorbing filaments 70 and may have cross-sectional areas that are smaller than the total cross-sectional area of fibers 52 (e.g., more than 5 times smaller, more than 10 times smaller, more than 20 times smaller, etc.).

Because light absorbing material 70 is formed at the outer surface of cladding 56 (e.g., at the interface with binder 58), the light absorbing material is unlikely to absorb light that is being guided through core 54 of the fiber. Stray light passing through the image transport layer may be absorbed by the light absorbing material 70.

As shown above, cladding for a fiber may include one or more layers between a fiber core and binder that holds the fibers together. The cladding may be coated on the fiber core and extend around the perimeter of the fiber core. If the cladding includes multiple layers, each layer may be referred to as a sublayer of the cladding or each layer may be referred to as a respective cladding. In some cases (as in FIG. 6), the cladding may be formed from a single light absorbing layer that directly contacts the core. In other cases (as in FIG. 7), the cladding may include a transparent layer that directly contacts the core and a light absorbing layer that is coated on the transparent layer. In general, the cladding may include any desired number of layers.

Image transport layer 16 may also be formed from Anderson localization material. Anderson localization material is characterized by transversely random refractive index features (e.g., higher index regions and lower index regions or regions of three or more or four or more different respective refractive indices) with a lateral size of about 300-500 nm, at least 100 nm, at least 700 nm, at least 1 micron, less than 5 microns, less than 1.5 microns, two wavelengths, or other suitable lateral size that are configured to exhibit two-dimensional transverse Anderson localization of light (e.g., the light output from the display of device 10). These refractive index variations are longitudinally invariant along the direction of light propagation and are generally perpendicular to the surface normal of a layer of Anderson localization material (e.g., the refractive index variations have filamentary shapes that run from the lower input surface of layer 16 of FIG. 1 to the upper output surface of layer 16 of FIG. 1). In some configurations, the filaments in an Anderson localization material may be bent, as shown by illustrative structures 16F near the edge of layer 16 of FIG. 1.

Anderson localization material can be used to form plates or other optical members such as layer 16 in FIG. 1. The plates may be layers with a thickness of at least 0.2 mm, at least 0.5 m, at least 1 mm, at least 2 mm, at least 5 mm, less than 20 mm, or other suitable thickness. Anderson localization material may also be used to form other image transport structures (e.g., straight and/or bent elongated light pipes, spherical shapes, cones, tapered shapes, etc.). As shown in FIG. 1, the surfaces of image transport layers such a layer 16 may be planar and/or may have curved profiles (e.g., the edges of device 10 may have rounded outer surfaces). These surfaces may be formed by performing operations such as slicing operations, grinding operations, and polishing operations on blocks of Anderson localization material.

Figure 10:
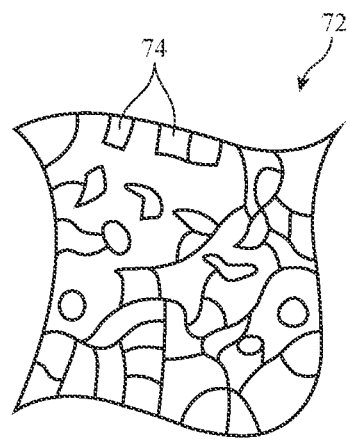
FIG. 10 is a cross-sectional view of illustrative Anderson localization material in accordance with an embodiment.

Illustrative Anderson localization material for forming layer 16 is shown in FIG. 10. As shown in FIG. 10, Anderson localization material 72 contains a random (pseudorandom) set of elongated optical structures 74 (e.g., filaments with different refractive index values). The filaments are distributed laterally with a random (pseudorandom) pattern. Material 72 may contain elongated optical structures (e.g., filaments) with 2-4, at least 2, at least 3, at least 4, fewer than 6, fewer than 5, or other suitable number of different materials of different respective refractive index values.

Figure 11:
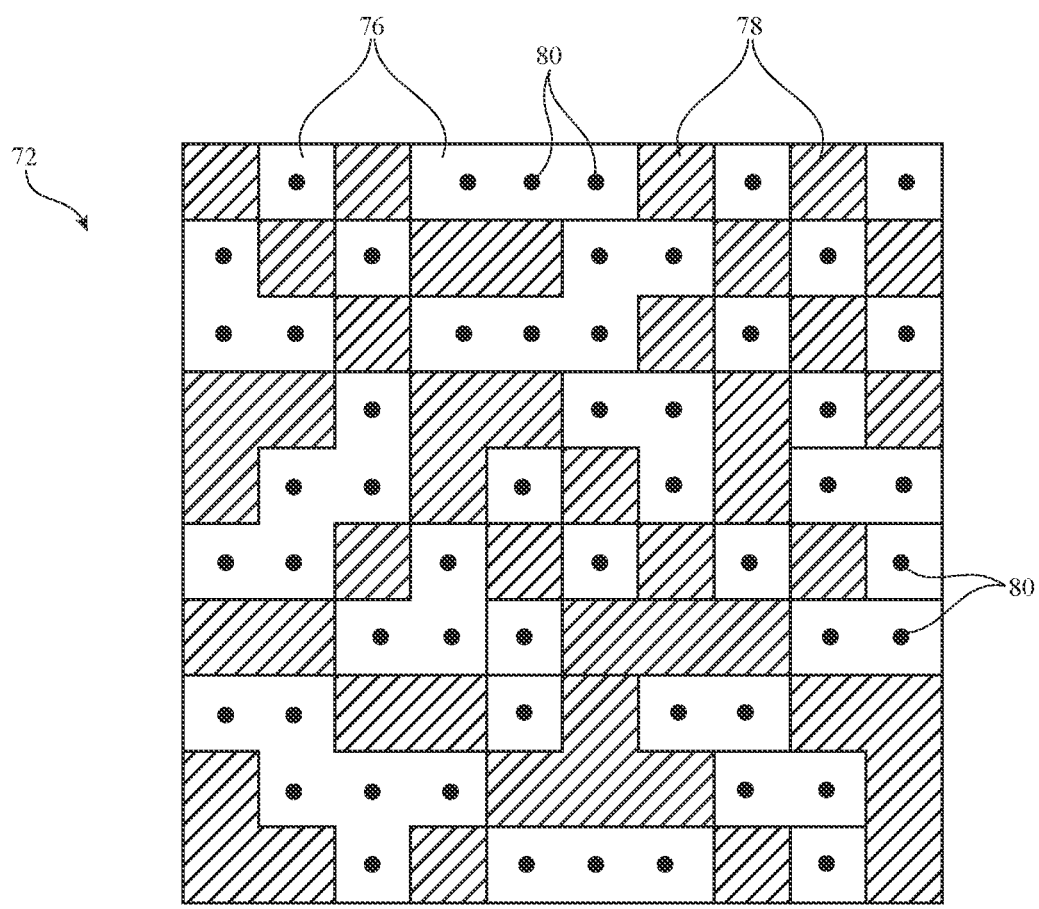
FIG. 11 is a cross-sectional view of illustrative Anderson localization material that includes light absorbing material incorporated into low-index filaments in accordance with an embodiment.

To absorb stray light within an image transport layer formed from Anderson localization material, the Anderson localization material may include light absorbing material in low-index filaments. FIG. 11 is a top view of Anderson localization material with high-index filaments and low-index filaments that include light absorbing material. As shown in FIG. 11, Anderson localization material 72 has two (or more) different types of polymer with different refractive index values. The filaments may include, for example, first filaments 76 interspersed with second filaments 78. First filaments 76 and second filaments 78 may have different respective refractive index values. For example, first filaments 76 may have a lower refractive index than second filaments 78. Additional filaments having different refractive indices may be used if desired.

The locations of filaments 76 and filaments 78 may be randomized laterally within Anderson localization material 72 (e.g., filaments 76 may be located at random locations within the X-Y plane and filaments 78 may be located at the remaining locations within the X-Y plane). The square cross-sectional shapes of each filament in FIG. 11 is merely illustrative. Each filament may have a cross-section of any desired shape.

Each low-index filament 76 in Anderson localization material 72 may include one or more portions of light absorbing material 80. Light absorbing material 80 may be light absorbing filaments formed from gray or black polymer layer. Alternatively, an absorbing additive (e.g., black dye, black pigment, etc.) 80 may be added to filaments 76. Incorporating light absorbing material into the low-index filaments in this manner results in stray light that is not guided by high-index filaments 78 being absorbed.

Light absorbing materials for the fibers and Anderson localization material of FIGS. 5-11 may be characterized as having a refractive index n and an extinction coefficient k. The extinction coefficient k (sometimes referred to as a k-parameter) of a material may be related to the absorption associated with that material. A lower k-parameter may correspond to higher absorption. The transparent polymers used to form image transport layer 16 may have k-parameters of between 0.01 and 0.1, greater than 0.01, approximately (e.g., within 10% of) 0.05, or any other desired magnitude. The light absorbing material may have a k-parameter of approximately 0.0005, less than 0.001, less than 0.01, between 0.0001 and 0.001 or any other desired magnitude. Said another way, the light absorbing material (e.g., a 100 micron thick piece of the light absorbing material) may absorb (e.g., may have an absorption percentage) between 25% and 75% of incident light, between 40% and 60% of the incident light, more than 5% of the incident light, more than 10% of the incident light, more than 25% of the incident light, more than 50% of the incident light, more than 60% of the incident light, more than 75% of the incident light, more than 80% of the incident light, less than 90% of the incident light, etc. In general, the absorbance of the light absorbing material may be tuned to optimize the performance of the image transport layer and electronic device display.

Figure 12:
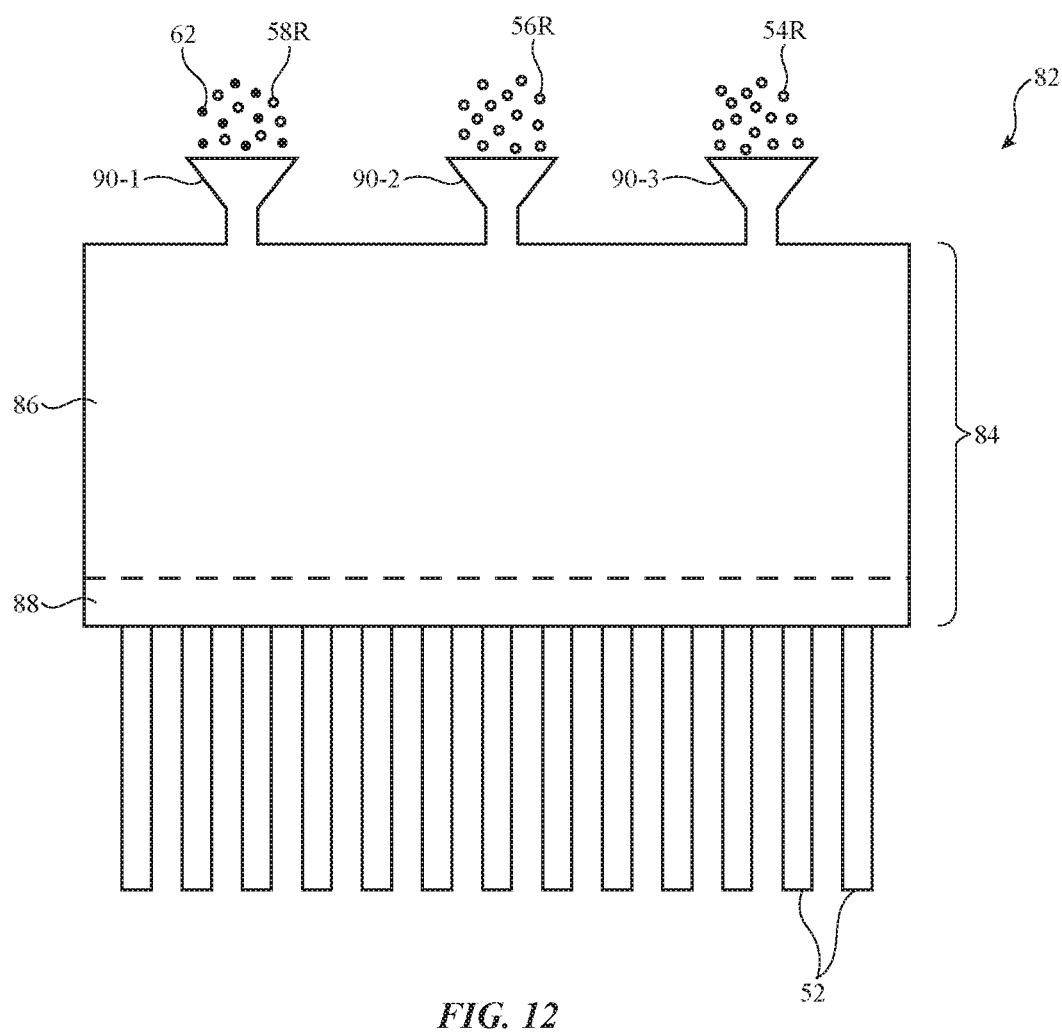
FIG. 12 is a side view of an illustrative extruder with a hopper that contains both raw material for a binder layer and light absorbing additive in accordance with an embodiment.

There are many ways to produce image transport layers having light absorbing material of the type shown in FIGS. 5-11. Fibers for image transport layer 16 may, for example, be extruded using an extruder. FIG. 12 is a diagram of an illustrative extruder that may be used to manufacture a fiber bundle. As shown in FIG. 12, extruder 82 may have hoppers 90 that contain raw material (e.g., polymers) for the different portions of image transport layer. A first hopper 90-1 may contain raw material 58R (e.g., a clear polymer) of a first refractive index for forming binder 58. A second hopper 90-2 may contain raw material 56R (e.g., a clear polymer) of a second refractive index that is lower than the first refractive index. Raw material 56R may be used to form fiber cladding 56. A third hopper 90-3 may contain raw material 54R (e.g., a clear polymer) that is used to form fiber cores 54. Polymer 54R may have a third refractive index that is higher than the second refractive index. Raw materials 54R, 56R, and 58R may be pellets for different types of polymers, in one example.

To incorporate stray light absorbing material into the fibers, a light absorbing additive 62 may be added to hopper 90-1 (in addition to the binder raw material 58R). In this arrangement, the additive will be distributed throughout binder layer 58 of the fibers 52 produced by extruder 82.

The different polymers in hoppers 90 may be heated to soften and/or liquefy these polymers so that these different polymers may be extruded through extruder die 84 to form fibers such as fibers 52. Extruder die 84 may include numerous melt distribution plates 86 and a spinneret 88. Melt distribution plates 86 (sometimes referred to as distribution plates 86, die plates 86, etc.) may guide the polymer material through the die to form fibers having desired shapes and dimensions. Spinneret 88 (sometimes referred to as die outlet plate 48) may form an outlet for die 84. The spinneret may have a number of openings. A corresponding fiber or fiber bundle may be output from each opening. There may be any desired number of openings in the spinneret (e.g., more than 100 openings, more than 1,000 openings, more than 5,000 openings, more than 10,000 openings, more than 20,000 openings, between 10,000 and 50,000 openings, between 10,000 and 30,000 openings, more than 100,000 openings, more than 150,000 openings, less than 300,000 openings, between 100,000 and 200,000 openings, between 150,000 and 200,000 openings, etc.).

In some cases, as show in FIG. 3, one individual fiber 52 may be output from each opening in spinneret 48. Alternatively, each opening in spinneret 48 may output a respective fiber bundle. Each fiber bundle may have a plurality of fibers 52 distributed in binder material 58. A process of this type in which fiber bundles each containing a plurality of fibers are extruded from die 84 may be referred to as islands-in-the-sea (IITS) extrusion. Extrusion die 84 may sometimes therefore be referred to as islands-in-the-sea extrusion die 84.

Figure 13:
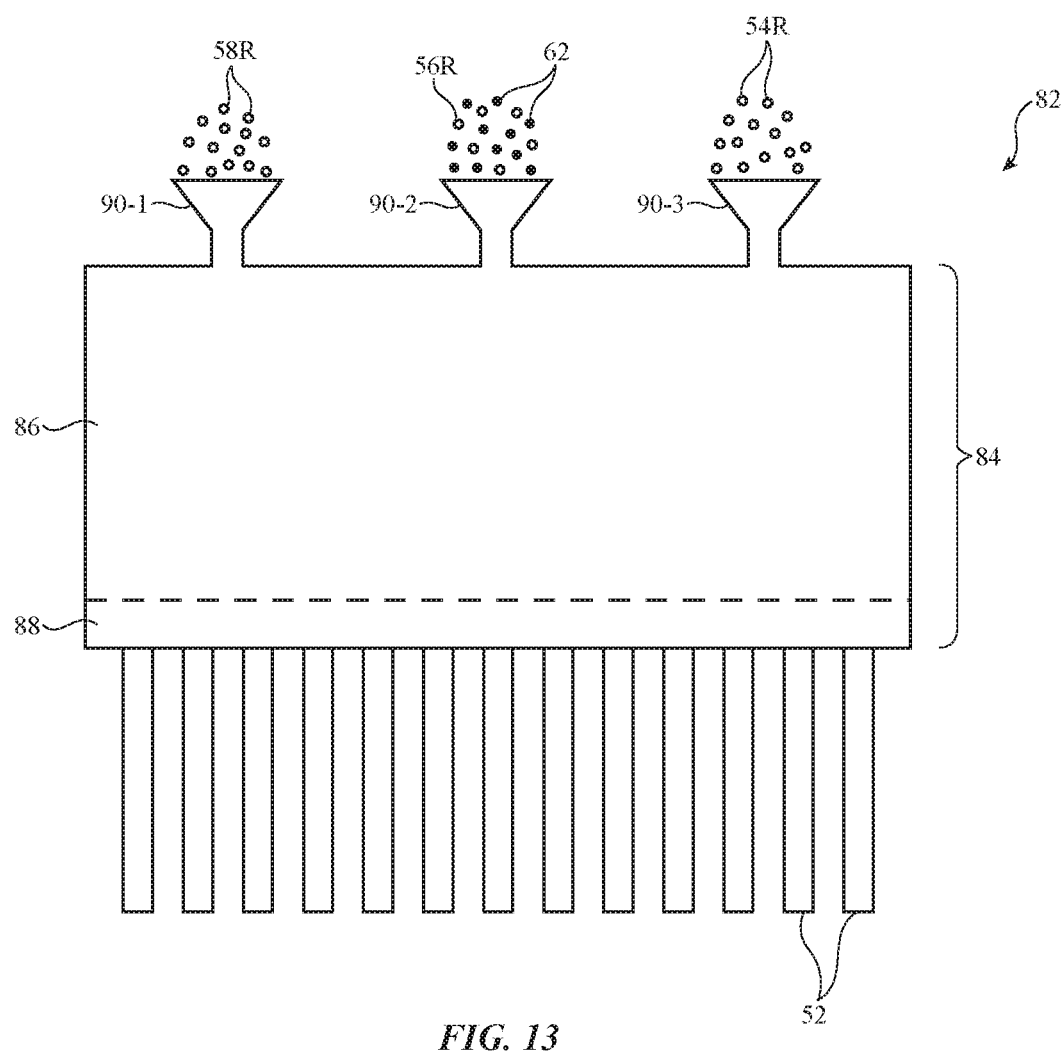
FIG. 13 is a side view of an illustrative extruder with a hopper that contains both raw material for a cladding layer and light absorbing additive in accordance with an embodiment.

The extrusion process of FIG. 12 may be used to produce fibers of the type shown in FIG. 5 (e.g., fibers having a light absorbing additive 62 distributed throughout binder layer 58). FIG. 13 is a diagram of an illustrative extruder that may be used to instead produce fibers of the type shown in FIG. 6. As shown in FIG. 13, a light absorbing additive 62 may be added to hopper 90-2 (in addition to the cladding raw material 56R). In this arrangement, the additive will be distributed throughout cladding 56 of the fibers 52 produced by extruder 82. The fibers 52 produced using the extruder of FIG. 13 therefore may have an arrangement of the type shown in FIG. 6 (with light absorbing additive evenly distributed throughout cladding 56).

Figure 14:
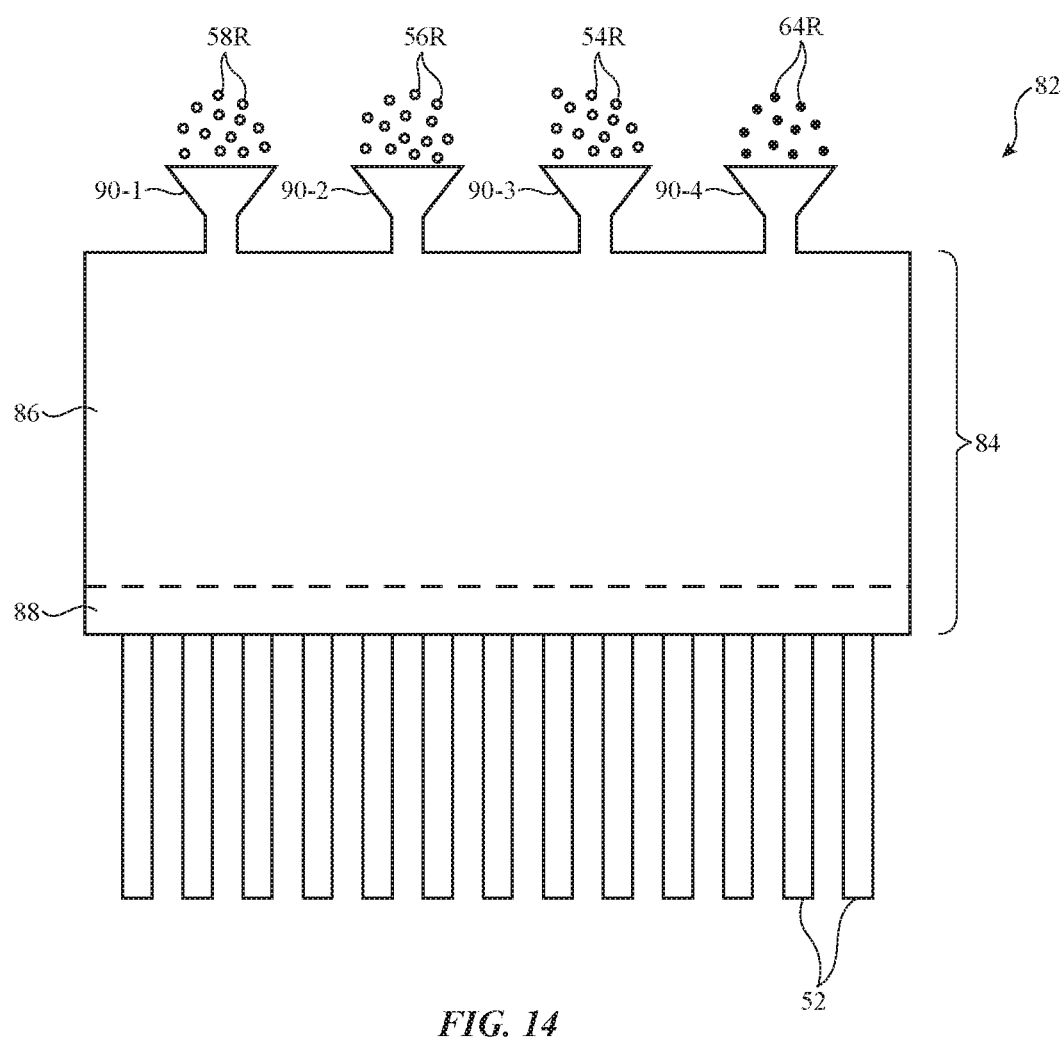
FIG. 14 is a side view of an illustrative extruder with a dedicated hopper that contains light absorbing material in accordance with an embodiment.

As shown in FIGS. 7-9, in some cases light absorbing material may not be evenly distributed throughout another component in fiber 52. Instead, a separate layer of light absorbing material may be included in each fiber 52 (as in FIGS. 7 and 8) or strips of light absorbing material may be distributed around cladding 56 (as in FIG. 9). FIG. 14 is a diagram of an illustrative extruder that may be used to produce fibers having separately formed light absorbing layers.

As shown in FIG. 14, a first hopper 90-1 may contain raw material 58R (e.g., a clear polymer) for forming binder 58. A second hopper 90-2 may contain raw material 56R (e.g., a clear polymer) for forming cladding 56. A third hopper 90-3 may contain raw material 54R for forming cores 54. Additionally, the extruder of FIG. 14 includes a separate hopper 90-4 that contains raw material 64R for forming a light absorbing layer 64 in fiber 52. Hopper 90-4 may contain a gray or black polymer for forming light absorbing layer 64. Alternatively, hopper 90-4 may contain raw material for a transparent polymer and a light absorbing additive. Ultimately, hopper 90-4 may be used to provide material that forms light absorbing layer 64 in FIG. 7 or 8. The extruder of FIG. 14 may produce fibers 52 of the type shown in FIG. 7 or of the type shown in FIG. 8. If two transparent claddings are included in each fiber (as shown in FIG. 8), raw material 56R in hopper 90-2 may optionally provide the raw material for both claddings 56-1 and 56-2. Alternatively, a fifth hopper with an additional raw material may be used in cases where claddings 56-1 and 56-2 are formed from different materials.

An extruder of the type shown in FIG. 14 may also be used to form the fibers of FIG. 9. Light absorbing portions 70 in FIG. 9 may be co-extruded with cores 54 and cladding 56. The raw material for light absorbing portions 70 may be contained in a dedicated hopper (e.g., hopper 90-4 in FIG. 14).

The light absorbing layers 64 of FIGS. 7 and 8 may also be formed on fibers 52 after the fibers are extruded. After extrusion, melt-spinning may solidify the fibers. The fibers may be produced having core 54 and cladding 56 (e.g., without light absorbing layer 64). Once solidified, a light absorbing coating may be applied to cladding 56 to form light absorbing layer 64. The light absorbing coating may be a curable coating (e.g., an ultraviolet-light-curable coating) that is cured after being applied to the fibers.

In the examples of FIGS. 12-14, extruder 82 is used to extrude fibers 52 or fiber bundles that include numerous fibers 52. This example is merely illustrative. An extruder may instead be used to extrude a preform that is subsequently drawn to form one or more fibers in a draw tower. Elongated cylindrical polymer preforms and polymer preforms of other shapes may be formed into elongated strands (e.g., fibers). Equipment such as a draw tower or other equipment for forming elongated polymer into strands may be used. As part of the drawing process, the lateral dimensions of the drawn material will shrink, so this type of process may help ensure that optical structures have desired lateral dimensions.

Figure 15:
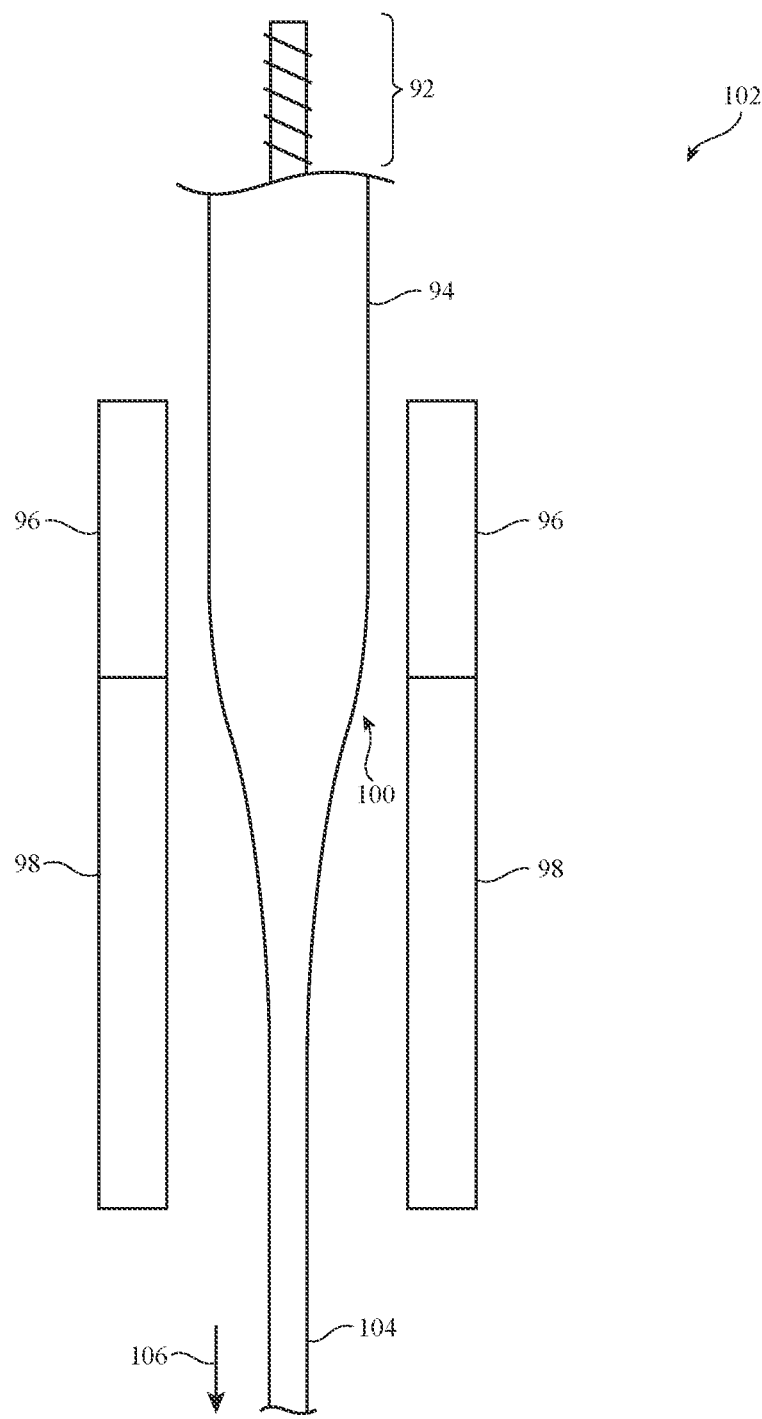
FIG. 15 is a side view of illustrative fiber drawing equipment such as a draw tower in accordance with an embodiment.

An illustrative draw tower is shown in FIG. 15. As shown in FIG. 15, draw tower 102 may have an adjustable feeder 92 such as a feeder based on a computer-controlled screw feed. Feeder 92 may be adjusted to adjust the speed at which preform 94 is lowered between heated walls 96 and 98. Walls 96 and 98 may surround preform 94 radially (e.g., walls 96 and 98 may be cylindrical and preform 94 may, during drawing operations, be lowered into the center of the cylindrical cavity formed by the cylindrical walls). The cylindrical walls may be heated to form an oven that heats preform 94. For example, walls 96 may be heated to a first (preheating) temperature and walls 98 may be heated to a second (hot zone) temperature. The first temperature may be sufficiently high to help preheat preform 94 (e.g., 130° C.) and the second temperature may be a higher working temperature (e.g., 180-200° C.) that causes preform 94 to soften and thereby form neck 100. This allows the polymer material of preform 94 to be drawn out of drawing tower 102 in direction 106 as thin fiber 104. If desired, the draw temperature (working temperature) used in draw tower 102 may be above the melting temperature of the materials being drawn.

FIGS. 16 and 17 show examples of preforms 100 that may be drawn to form fibers having desired arrangements. Preforms 100 may include coextruded polymer (e.g., formed using an extruder of the type shown in FIGS. 12-14). Alternatively, some or all of the preform may be formed by polymer raw material (e.g., polymer pellets).

As shown in FIG. 16, preform 100 may include raw material 54R for forming core 54 of fiber 52. Raw material 54R may be contained within a cladding portion such as cladding portion 112. Cladding portions 112 and 114 may be formed by tubes of a transparent polymer and may serve to improve the speed and ease of manufacturing fibers. Raw material 56R for forming cladding portion 116 may be formed between cladding portions 112 and 114.

After preform 100 is drawn (e.g., using the draw tower of FIG. 15) into a fiber, the resulting fiber may have a cladding 56 that includes three portions (formed by cladding portion 112, cladding portion 116, and cladding portion 114). The cladding portions 112 and 114 may be sufficiently thin so that cladding portion 116 comprises the majority of the cladding in the final fiber. Cladding portions 112 and 114 may be formed from the same material as cladding material 56R or may be formed from a different material than cladding material 56R. In one example, cladding portions 112 and 114 may be formed from poly(methyl methacrylate) (PMMA) and raw material 56R may be a fluoropolymer such as THV (terpolymer of tetrafluoroethylene, hexafluoropropylene and vinylidene fluoride). These examples are merely illustrative and in general each component in preform 100 may be formed from any desired material.

In FIG. 16, light absorbing material 70 may be formed in cladding portion 116 alongside raw material 56R. As shown, the light absorbing material 70 may be formed in cladding portion 116 at the interface between cladding portions 116 and 114. Forming the light absorbing material at the outer part of cladding portion 116 ensures that light guided by core 54 in the fiber is less likely to be exposed to the light absorbing material. Light absorbing material 70 may be formed by a pre-drawn light absorbing fiber. Light absorbing fibers 70 may optionally be formed from the same or a similar material as raw material 56R for minimal disruption to the preform drawing conditions. For example, if raw material 56R is transparent THV, light absorbing fibers 70 may be formed from black THV.

After preform 100 of FIG. 16 is drawn, the resulting fiber 52 may have an arrangement similar to as shown in FIG. 9. The light absorbing material is formed at an outer part of cladding 56. Any desired number of light absorbing fibers 70 may be incorporated into the preform (e.g., four, eight, more than eight, more than twenty, more than fifty, more than one hundred, less than one hundred, less than ten, less than five, etc.).

FIG. 17 shows another example of a preform with light absorbing material 70. In FIG. 17, light absorbing material 70 is incorporated into cladding portion 114. Cladding portion 114 may be co-extruded with light absorbing material 70 such that the tube has localized regions (lines) of black light absorbing material. Light absorbing material 70 may be formed from the same polymer as cladding portion 114. For example, light absorbing material 70 may be formed by black PMMA that is co-extruded with transparent PMMA that forms the rest of cladding portion 114.

In yet another embodiment, light absorbing material may be uniformly distributed throughout cladding portion 114. In other words, a uniformly gray or black PMMA cladding portion 114 may be used to form the light absorbing portion of the preform.

Additionally, instead of co-extruding light absorbing portions 70 with cladding portion 114, pre-drawn light absorbing fibers 70 may be heat-melted onto the outer surface of cladding portion 114 during preform assembly. In other words, the light absorbing fibers 70 may be heated while applied to the outer surface of cladding portion 114. As cladding portion 114 and light absorbing fibers 70 soften (and/or liquefy), the light absorbing fibers may become integrated with cladding portion 114. The cladding portion may then be allowed to cool, securing the light absorbing fibers 70 at the outer surface of the cladding portion. Cladding portion 114 may be formed from transparent PMMA and light absorbing fibers 70 may be formed from black PMMA, black polyvinylidene fluoride (PVDF), or another desired material.

After preform 100 of FIG. 17 is drawn, the resulting fiber 52 may have an arrangement similar to as shown in FIG. 9. The light absorbing material is formed at an outer part of cladding 56. Any desired number of light absorbing fibers 70 may be incorporated into the preform (e.g., four, eight, more than eight, more than twenty, more than fifty, more than one hundred, less than one hundred, less than ten, less than five, etc.).

FIG. 18 is a top view of a fiber 52 formed by drawing preform 100 of FIG. 16. As shown, cladding 56 surrounds core 54 and includes portions 112, 114, and 116. Light absorbing material 70 is formed in cladding portion 116 on the side of cladding portion 116 adjacent to cladding portion 114. FIG. 19 is a top view of a fiber 52 formed by drawing preform 100 of FIG. 17. As shown, cladding 56 surrounds core 54 and includes portions 112, 114, and 116. Light absorbing material 70 is formed in cladding portion 114.

After fibers 52 (e.g., from FIGS. 18 and 19) are drawn, the fibers may be fused together to form a coherent fiber bundle that is then used to form image transport layer 16.

To form Anderson localization material with light absorbing material (as shown in FIG. 11), an extruder may be used to extrude elongated members each having areas of transversely randomized refractive index. Light absorbing material may be co-extruded with the elongated low-index members or may be incorporated into the low-index polymer as an additive. After extrusion, a fuser may be used to fuse together the elongated members to form a preform. Then, the preform may be drawn to form fiber. Lengths of the fiber may be fused together to form a material for the image transport layer.

Figure 20:
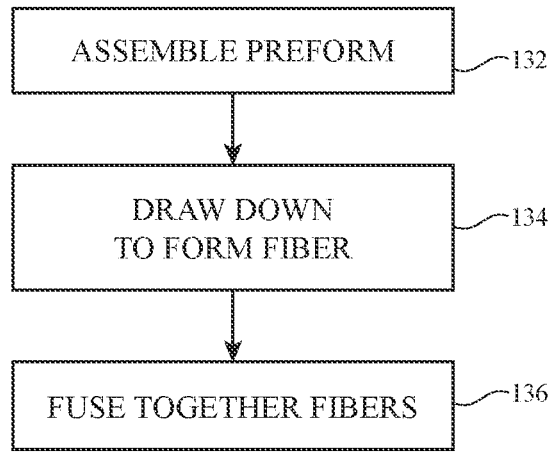
FIG. 20 is a flow chart of illustrative steps involved in forming an image transport layer for an electronic device display in accordance with an embodiment.

FIG. 20 is a flowchart of illustrative steps involved in forming an image transport layer for an electronic device display in accordance with an embodiment. As shown, at step 132, a preform (such as the preform of FIG. 16 or FIG. 17) may be assembled. The preform may be at least partially assembled using extrusion. Raw materials (e.g., polymer pellets) may be incorporated into preform. Light absorbing material may also be incorporated into the preform. Next, at step 134, the preform may be drawn down to form fiber (e.g., using the drawing equipment of FIG. 15). The fiber may then be fused together at step 136 with other fibers having similar or the same structure. This forms a coherent fiber bundle that may undergo additional cutting, shaping, polishing, etc. to form a finished image transport layer. In cases where the fibers are extruded (and not drawn), the extruded fibers may be fused together after extrusion similar to as in step 136 of FIG. 20.

Figure 21:
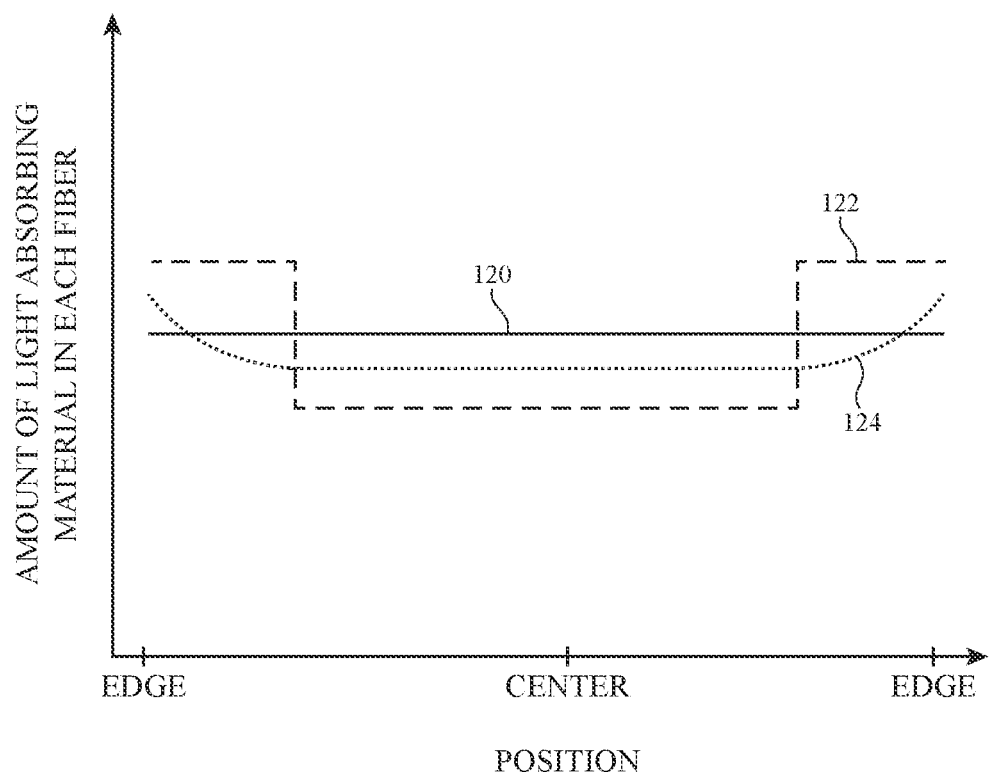
FIG. 21 is a graph showing various profiles for the amount of light absorbing material in each fiber versus position across the image transport layer in accordance with an embodiment.

FIG. 21 is a graph of the amount of light absorbing material in each fiber as a function of position across the image transport layer. In one embodiment, the fibers of image transport layer 16 in device 10 may have a uniform structure across the image transport layer. In other words, the fibers may have the same amount of light absorbing material regardless of the position of the fiber. Profile 120 depicts an arrangement of this type, with the amount of light absorbing material remaining constant across the entire image transport layer.

In other arrangements, the amount of light absorbing material in each fiber may vary as a function of position across the image transport layer. The optimal amount of light absorbing material may be higher for the bent fibers at the edge of the image transport layer than in the unbent fibers in the center of the image transport layers. Profiles 122 and 124 show examples where the amount of light absorbing material varies as a function of position. As shown, the amount of light absorbing material may be higher at the edge of the image transport layer than in the center of the image transport layer. There may be a step-change in the amount of light absorbing material (as in profile 122) or the amount of light absorbing material may change gradually (as in profile 124). The amount of light absorbing material may change in linear, non-linear, or step-wise fashion.

It should be understood that the amount of light absorbing material varying as a function of position is merely illustrative. Instead, the absorbance of the light absorbing material may vary as a function of position to achieve the same effect.

Figure 22A:
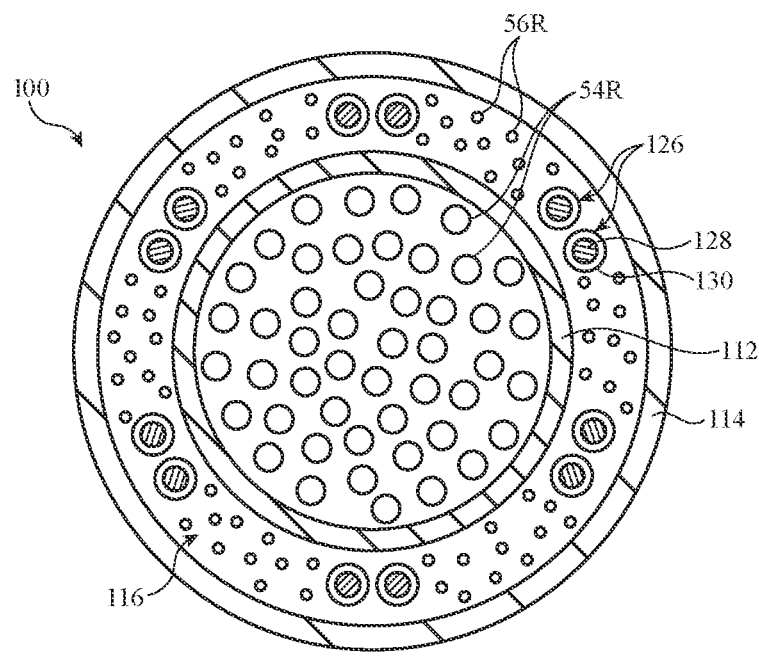
FIG. 22A is a top view of an illustrative polymer preform that includes protected light absorbing fibers in an outer cladding portion in accordance with an embodiment.
Figure 23A:
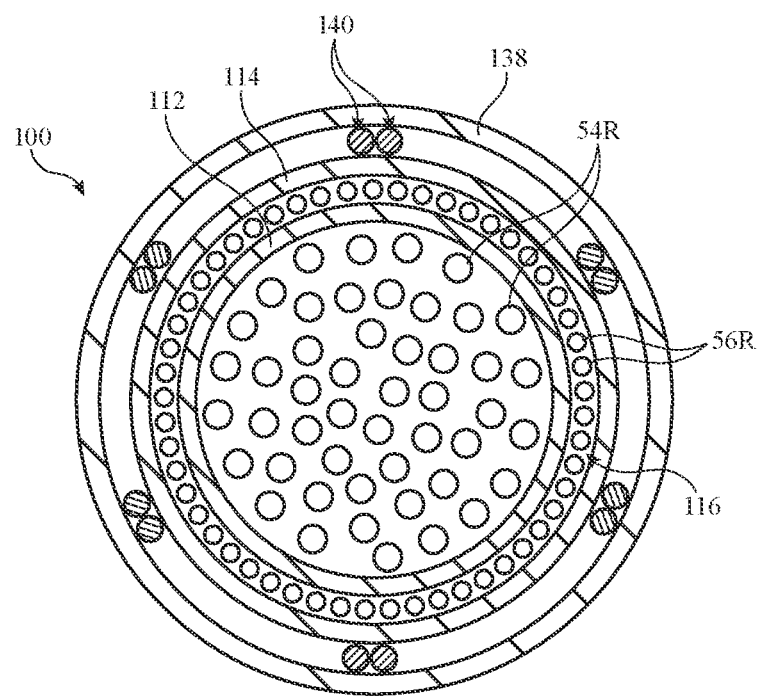
FIG. 23A is a top view of an illustrative polymer preform that includes light absorbing fibers between transparent outer cladding portions in accordance with an embodiment.
Figure 24A:
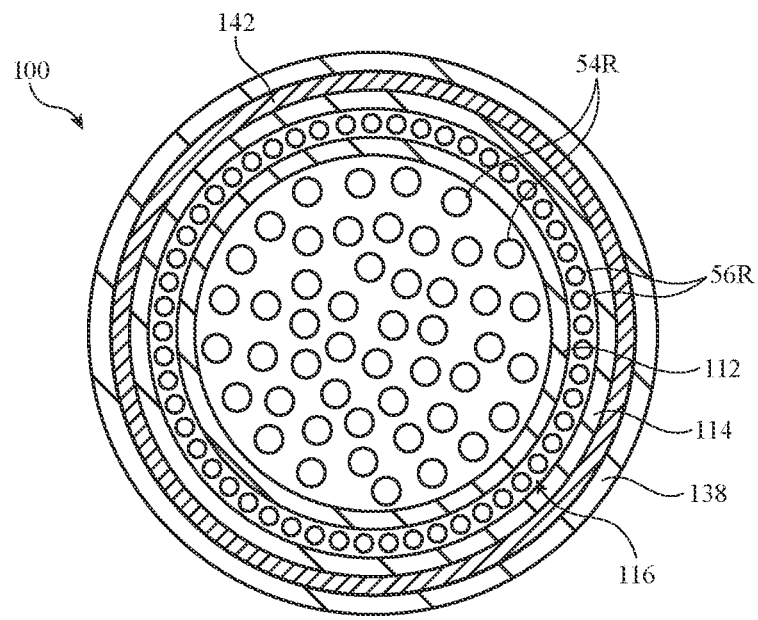
FIG. 24A is a top view of an illustrative polymer preform that includes a ring of light absorbing material between transparent outer cladding portions in accordance with an embodiment.

FIGS. 22A, 23A, and 24A show additional examples of preforms 100 that may be drawn to form fibers having desired arrangements. Preforms 100 may include coextruded polymer (e.g., formed using an extruder of the type shown in FIGS. 12-14). Alternatively, some or all of the preform may be formed by polymer raw material (e.g., polymer pellets).

As shown in FIG. 22A, preform 100 may include raw material 54R for forming core 54 of fiber 52. Raw material 54R may be contained within a cladding portion such as cladding portion 112. Cladding portions 112 and 114 may be formed by tubes of a transparent polymer and may serve to improve the speed and ease of manufacturing fibers. Raw material 56R for forming cladding portion 116 may be formed between cladding portions 112 and 114.

In FIG. 22A, protected light absorbing fibers 126 (sometimes referred to as light absorbing filaments, light absorbing fibers, protected light absorbing filaments, sheathed light absorbing filaments, sheathed light absorbing fibers, etc.) are included between cladding portions 112 and 114 in addition to raw material 56R. The protected light absorbing fibers 126 include a light absorbing core 128 that is formed from a light absorbing material. The protected light absorbing fibers also include a protective sheath 130 for containing the light absorbing material of core 128. Protective sheath 130 may be transparent and may be referred to as a cladding, protective layer, protective sheath, protective tube, etc. Without protective sheath 130 (e.g., in an arrangement similar to as in FIG. 16 or FIG. 17), the light absorbing material of core 128 may undesirably diffuse out of the cladding (e.g., into the core or binder). By including protective sheath 130 around each light absorbing core 128, the light absorbing material is kept in a desired location in the fiber (within the cladding) during subsequent processing.

The protected light absorbing fibers 126 may be formed by a pre-drawn light absorbing fiber or may be co-extruded with one or more other components of the preform. Light absorbing cores 128 may optionally be formed from the same or a similar material as raw material 56R for minimal disruption to the preform drawing conditions. For example, if raw material 56R is transparent THV, light absorbing cores 128 may be formed from black THV.

After preform 100 is drawn (e.g., using the draw tower of FIG. 15) into a fiber, the resulting fiber may have a cladding 56 that includes three portions (formed by cladding portion 112, cladding portion 116, and cladding portion 114). The cladding portions 112 and 114 may be sufficiently thin so that cladding portion 116 comprises the majority of the cladding in the final fiber.

Cladding portions 112 and 114, cladding material 56R, and sheaths 130 of the protected light absorbing fibers 126 may be formed from the same material or one or more different materials. Cladding portions 112 and 114, cladding material 56R, and sheaths 130 of the protected light absorbing fibers 126 may all be transparent. Cladding portions 112 and 114, cladding material 56R, and sheaths 130 of the protected light absorbing fibers 126 may each be formed from a material such as poly(methyl methacrylate) (PMMA), a fluoropolymer such as THV (terpolymer of tetrafluoroethylene, hexafluoropropylene and vinylidene fluoride), polyvinylidene fluoride (PVDF), or EFEP (a terpolymer of ethyelene, tetrafluoroethylene, and hexafluoropropylene), polycarbonate (PC), polystyrene (PS), etc. Light absorbing cores 126 may be formed from black THV or any other desired light absorbing material. In one arrangement, sheaths 130 are formed from a different material than cladding portions 112 and 114. In one arrangement, sheaths 130 are formed from a different material than raw material 56R (e.g., the remaining portion of cladding portion 116).

These examples are merely illustrative and in general each component in preform 100 may be formed from any desired material.

Figure 22B:
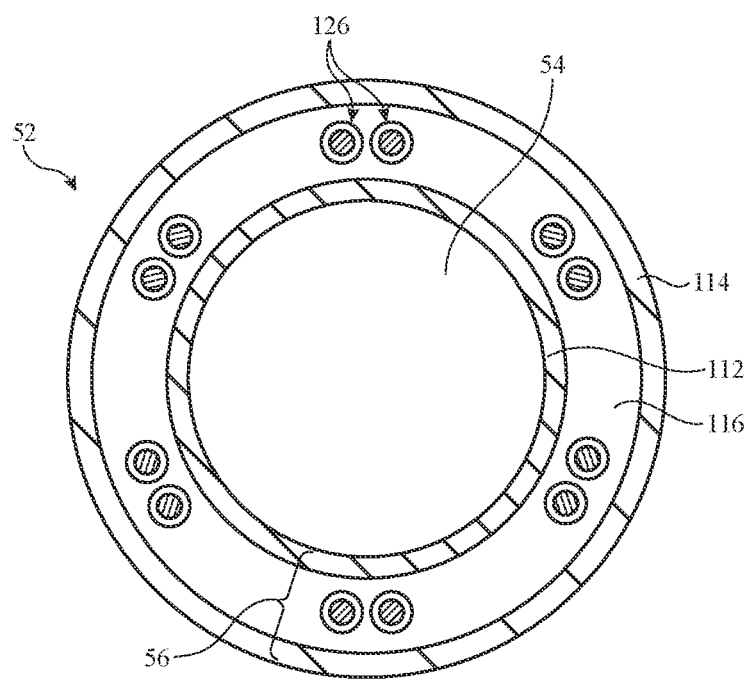
FIG. 22B is a top view of an illustrative fiber that is formed by drawing the polymer preform of FIG. 22A in accordance with an embodiment.

FIG. 22B is a top view of a fiber 52 formed by drawing preform 100 of FIG. 22A. As shown, cladding 56 surrounds core 54 and includes portions 112, 114, and 116. Sheathed light absorbing fibers 126 (with light absorbing cores 128 and protective sheaths 130) are formed in cladding portion 116 (e.g., on the side of cladding portion 116 adjacent to cladding portion 114).

FIG. 22A shows one option for preventing diffusion of light absorbing material out of the cladding (e.g., by encasing the light absorbing fibers in individual transparent protective sheaths). Another option is to include an additional transparent cladding layer (e.g., that is concentric with cladding portions 112 and 114). An embodiment of this type is shown in FIG. 23A.

As shown in FIG. 23A, preform 100 may include raw material 54R for forming core 54 of fiber 52. Similar to as in FIG. 22A, raw material 54R in FIG. 23A may be contained within a cladding portion such as cladding portion 112. Cladding portions 112 and 114 may be formed by tubes of a transparent polymer and may serve to improve the speed and ease of manufacturing fibers. Raw material 56R for forming cladding portion 116 may be formed between cladding portions 112 and 114.

The preform 100 in FIG. 23A also includes an additional cladding portion 138 formed around cladding portion 114 (e.g., cladding portion 114 is interposed between cladding portions 112 and 138). The cladding portions 138, 112, and 114 are concentric transparent polymer tubes.

In FIG. 23A, light absorbing fibers 140 (sometimes referred to as light absorbing filaments) are included between cladding portions 114 and 138. Positioning the light absorbing fibers between the cladding portions 114 and 138 may prevent the light absorbing fibers from diffusing into the fiber core or binder layer.

The light absorbing fibers 140 may be formed by a pre-drawn light absorbing fiber or may be co-extruded with one or more other components of the preform. Light absorbing fibers 140 may optionally be formed from the same or a similar material as raw material 56R for minimal disruption to the preform drawing conditions. For example, if raw material 56R is transparent THV, light absorbing fibers 140 may be formed from black THV.

Similar to as discussed in connection with FIG. 22A, cladding portions 112, 114, and 138 as well as cladding material 56R may all be formed from the same material or one or more different materials (e.g., PMMA, THV, PVDF, EFEP, PC, PS, etc.). Cladding portions 112, 114, and 138 as well as cladding material 56R may all be transparent. Light absorbing fibers 140 may be formed from black THV or any other desired light absorbing material. These examples are merely illustrative and in general each component in preform 100 may be formed from any desired material.

Figure 23B:
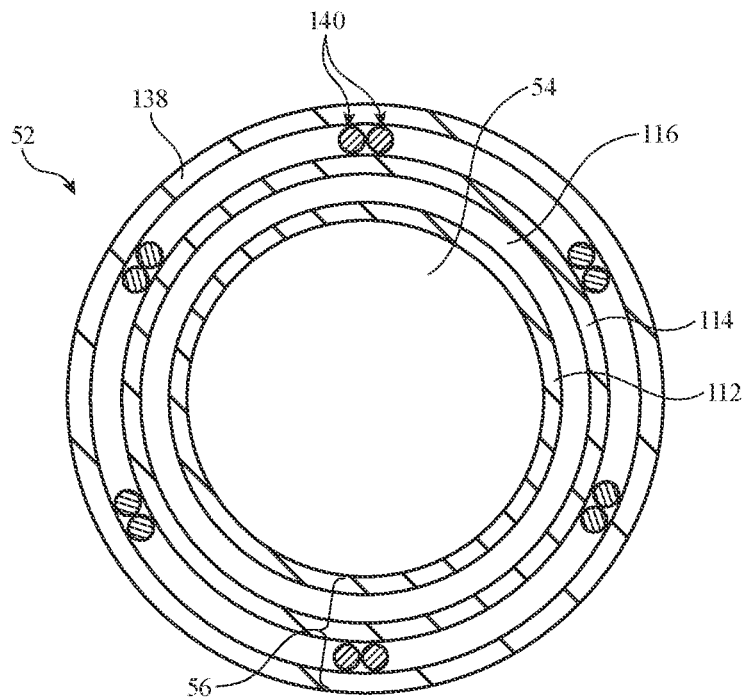
FIG. 23B is a top view of an illustrative fiber that is formed by drawing the polymer preform of FIG. 23A in accordance with an embodiment.

FIG. 23B is a top view of a fiber 52 formed by drawing preform 100 of FIG. 23A. As shown, cladding 56 surrounds core 54 and includes portions 112, 114, 116, and 138. Cladding 56 also includes light absorbing fibers 140 between cladding portions 114 and 138.

FIG. 24A shows a preform having a similar arrangement to the preform of FIG. 23A. Specifically, preform 100 of FIG. 24A includes raw material 54R contained within a cladding portion 112. Raw material 56R for forming cladding portion 116 may be formed between cladding portions 112 and 114. The preform also includes an additional cladding portion 138 formed around cladding portion 114 (e.g., cladding portion 114 is interposed between cladding portions 112 and 138). The cladding portions 138, 112, and 114 are concentric transparent polymer tubes.

However, instead of incorporating light absorbing fibers 140 between cladding portions 114 and 138 (e.g., light absorbing islands as in FIG. 23A), the preform of FIG. 24A includes a light absorbing ring 142 between cladding portions 114 and 138. The light absorbing ring 142 may be co-extruded with one or more other components of the preform (e.g., may be co-extruded with adjacent cladding portions 114 and 138), may be applied as a coating on cladding portion 114, may be formed using pellets, etc. Ultimately, the light absorbing material 142 forms a ring around the core (e.g., concentric with cladding portions 112, 114, 116, and 138. Light absorbing ring 142 (sometimes referred to as light absorbing tube 142) may be formed from black THV or any other desired light absorbing material. In general, each component in preform 100 may be formed from any desired material.

Figure 24B:
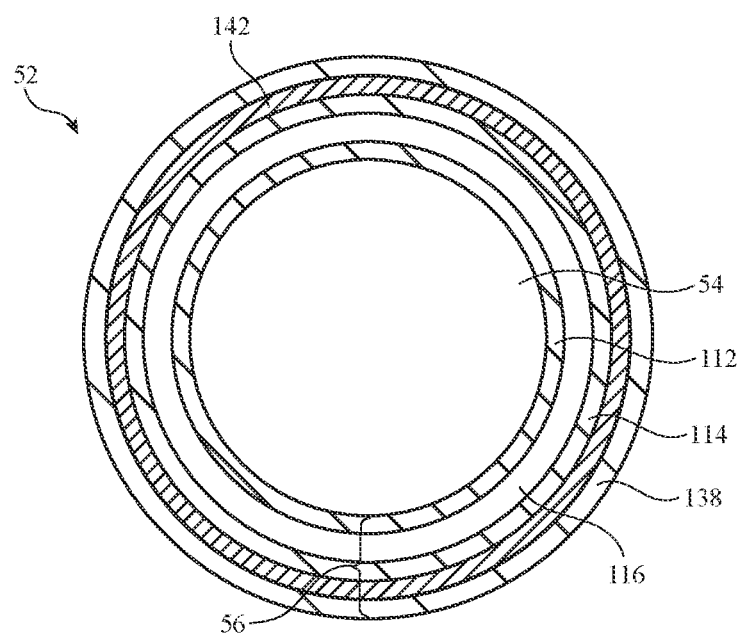
FIG. 24B is a top view of an illustrative fiber that is formed by drawing the polymer preform of FIG. 24A in accordance with an embodiment.

FIG. 24B is a top view of a fiber 52 formed by drawing preform 100 of FIG. 24A. As shown, cladding 56 surrounds core 54 and includes transparent portions 112, 114, 116, and 138. Cladding 56 also includes light absorbing material 142 (e.g., a light absorbing tube) between cladding portions 114 and 138.

The drawing and fusing process of FIG. 21 may be used to form a coherent fiber bundle using any of the preforms of FIGS. 22A, 23A, and 24A.

Figure 25A:
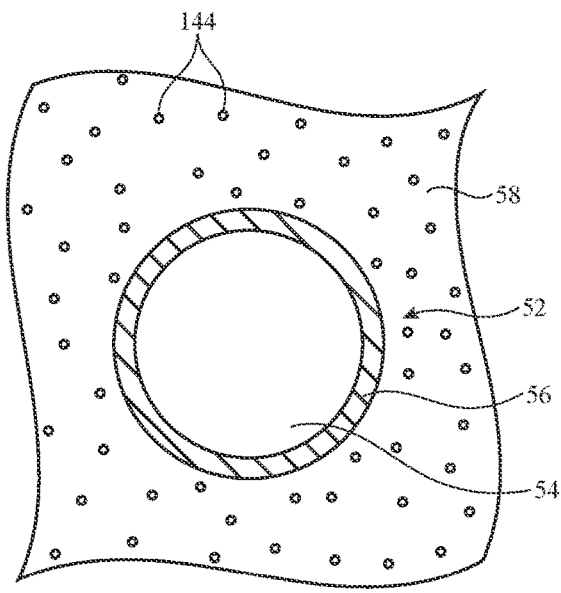
FIG. 25A is a top view of an illustrative fiber surrounded by a binder material that includes a doped light absorbing additive in accordance with an embodiment.
Figure 25B:
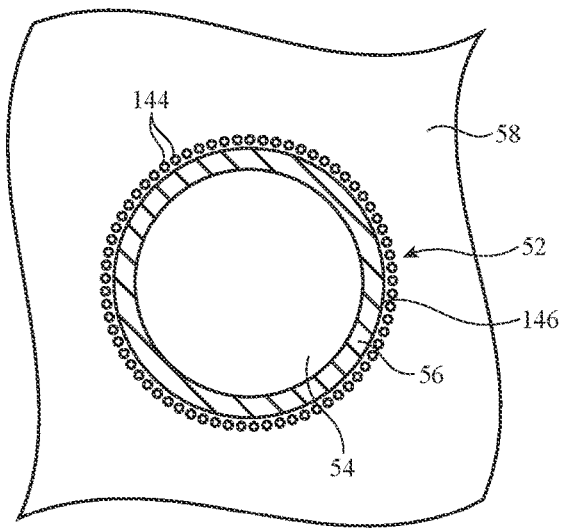
FIG. 25B is a top view of the illustrative fiber of FIG. 25A after heat causes the doped light absorbing additive to preferentially aggregate on an outer surface of the cladding of the fiber in accordance with an embodiment.

FIGS. 25A and 25B show another possible technique for forming light absorbing material in a fiber cladding. FIG. 25A shows a top view of a fiber with a core and cladding in a binder material. As shown, fiber 52 includes a core 54 and cladding 56 and is surrounded by binder material 58. However, in FIG. 25A, a light absorbing material 144 is distributed throughout binder 58.

The light absorbing material 144 may be black pigment, black dye, or other light absorbing material that absorbs and blocks light (e.g., carbon black based material, carbon nanotubes, graphite nanoplatelets, etc.). Additionally, the light absorbing material 144 may be doped to cause a preferential attraction to the material of cladding 56. For example, in the scenario in which cladding 56 is formed from a fluoropolymer such as THV, light absorbing material 144 may be fluorine-doped.

Upon the application of heat to the fiber 52 and binder material 58, the doped light absorbing material preferentially aggregates on the surface of cladding 56. FIG. 25B is a top view of the fiber after heat has been applied. As shown, the doped light absorbing material 144 aggregates on an outer surface 146 of cladding 56. The light absorbing material 144 may be considered a part of cladding 56 (e.g., cladding 56 has a transparent portion with an outer surface and a light absorbing coating on the outer surface of the transparent portion).

In one illustrative example, the transparent portion of cladding 56 may be formed form a fluoropolymer such as THV, PVDF, or EFEP. The light absorbing material may therefore be fluorine-doped, resulting in a preferential attraction between the light absorbing material and transparent cladding material. Light absorbing material 144 may be a fluorine-doped black dye, as one example.

It should be noted that the illustrative fiber (with a core 54 and transparent cladding portion 56) depicted in FIGS. 25A and 25B is merely illustrative. If desired, the cladding may have one or more layers (e.g., as shown in connection with FIG. 7, FIG. 8, FIG. 18, FIG. 19, etc). The technique of FIGS. 25A and 25B may be used as long as the outer-most transparent cladding layer and the doped light absorbing additive have a preferential attraction to one another (resulting in the light absorbing additives aggregating on the outer surface of the cladding). One or more additional interior cladding layers (of any desired material) may optionally be included in the fiber without disrupting the desired final arrangement (of having light absorbing material on an outer surface of the cladding).

Figure 26:
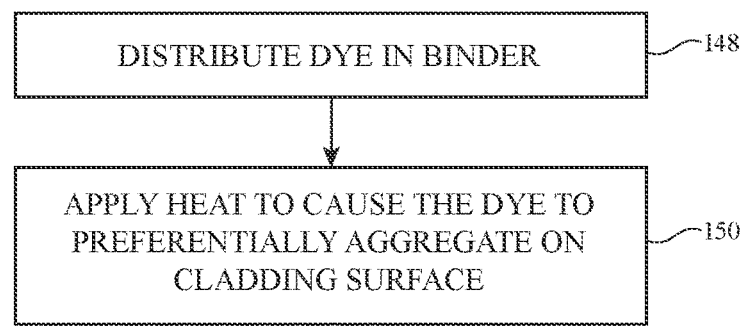
FIG. 26 is a flow chart of illustrative steps involved in using a doped light absorbing additive in a binder material to form a light absorbing cladding in accordance with an embodiment.

FIG. 26 is a flowchart of illustrative steps involved in forming fibers with a light absorbing coating on an outer surface of the cladding in accordance with an embodiment. At step 148, the doped light absorbing material (e.g., fluorine-doped black dye) may be distributed throughout the binder material. The binder material (e.g., the host binder material in which the dye is mixed) may be transparent. The light absorbing material may be mixed with the transparent binder raw material during extrusion, in one example. Twin screw extrusion (TSE), single screw extrusion (SSE), or brabender extrusion may be used for combining the transparent binder raw material and doped light absorbing dye. In general, any desired manufacturing techniques may be used to form the fibers surrounded by a binder material having a distributed doped light absorbing dye. The fibers may undergo melt-spinning or other processing during manufacturing.

Next, at step 150, heat may be applied to cause the doped light absorbing material to preferentially aggregate on the cladding surface. Heat may be applied at one or more times during the formation of the fibers and coherent fiber bundles. Heat may be applied as multiple fibers are fused together to form a coherent fiber bundle, during annealing of the coherent fiber bundle, etc. These applications of heat cause the doped light absorbing material that is mixed in the binder material to aggregate on the outer surface of the fiber cladding (e.g., as shown in FIG. 25B).

The foregoing is merely illustrative and various modifications can be made to the described embodiments. The foregoing embodiments may be implemented individually or in any combination.

What is claimed is:

1. An electronic device comprising:
   an array of pixels configured to display an image; and
   an image transport layer having an input surface and an output surface, wherein the image transport layer is configured to transport the image from the input surface to the output surface and wherein the image transport layer includes a plurality of fibers that each comprise:
      a core that extends along a length; and
      a light absorbing cladding formed around the core, wherein the light absorbing cladding comprises a transparent polymer and elongated strips of light absorbing material that extend parallel to the length and wherein the elongated strips are distributed around a perimeter of the transparent polymer.

2. The electronic device defined in claim 1, wherein the light absorbing material is a light absorbing polymer material.

3. The electronic device defined in claim 1, wherein the light absorbing cladding has an inner surface and an opposing outer surface, wherein the inner surface is adjacent to the core, and wherein the elongated strips of light absorbing material are formed at the outer surface of the light absorbing cladding.

4. The electronic device defined in claim 1, wherein each strip of light absorbing material is contained within a respective transparent tube.

5. The electronic device defined in claim 1, wherein the elongated strips of light absorbing material are black fibers.

6. The electronic device defined in claim 1, wherein the elongated strips of light absorbing material are gray fibers.

7. The electronic device defined in claim 1, wherein the elongated strips of light absorbing material each have a first cross-sectional area that is more than 5 times smaller than a second cross-sectional area of each fiber of the plurality of fibers.

8. An electronic device comprising:
   an array of pixels configured to display an image; and
   an image transport layer having an input surface and an output surface, wherein the image transport layer is configured to transport the image from the input surface to the output surface and wherein the image transport layer includes a plurality of fibers that each comprise:
      a core; and
      a light absorbing cladding formed around the core, wherein the light absorbing cladding comprises a transparent portion, wherein the transparent portion is formed from a fluoropolymer and has an outer surface, and wherein the light absorbing cladding further comprises a coating of fluorine-doped light absorbing dye on the outer surface of the transparent portion.

9. The electronic device defined in claim 8, wherein the fluoropolymer is polyvinylidene fluoride.

10. The electronic device defined in claim 8, wherein the fluoropolymer is a terpolymer of ethyelene, tetrafluoroethylene, and hexafluoropropylene.

11. An electronic device comprising:
    an array of pixels configured to display an image; and
    an image transport layer having an input surface and an output surface, wherein the image transport layer is configured to transport the image from the input surface to the output surface and wherein the image transport layer includes a plurality of fibers that each comprise:
       a core; and
       a light absorbing cladding formed around the core, wherein the plurality of fibers includes a first fiber at an edge of the image transport layer and a second fiber at a center of the image transport layer, wherein the first fiber includes light absorbing material having a first absorbance magnitude, and wherein the second fiber includes light absorbing material having a second absorbance magnitude that is less than the first absorbance magnitude.

12. The electronic device defined in claim 8, wherein the fluoropolymer is a terpolymer of tetrafluoroethylene, hexafluoropropylene and vinylidene fluoride.

* * * * *